(12) United States Patent
Zhang et al.

(10) Patent No.: US 11,762,690 B2
(45) Date of Patent: Sep. 19, 2023

(54) DATA PROCESSING METHOD AND RELATED PRODUCTS

(71) Applicant: CAMBRICON TECHNOLOGIES CORPORATION LIMITED, Beijing (CN)

(72) Inventors: Yao Zhang, Beijing (CN); Xiaofu Meng, Beijing (CN); Shaoli Liu, Beijing (CN)

(73) Assignee: CAMBRICON TECHNOLOGIES CORPORATION LIMITED, Beijing (CN)

(*) Notice: Subject to any disclaimer, the term of this patent is extended or adjusted under 35 U.S.C. 154(b) by 587 days.

(21) Appl. No.: 16/623,837

(22) PCT Filed: Jul. 19, 2019

(86) PCT No.: PCT/CN2019/096859
§ 371 (c)(1),
(2) Date: Dec. 18, 2019

(87) PCT Pub. No.: WO2020/211205
PCT Pub. Date: Oct. 22, 2020

(65) Prior Publication Data
US 2021/0334137 A1 Oct. 28, 2021

(30) Foreign Application Priority Data

Apr. 18, 2019 (CN) .......................... 201910315962.9
May 23, 2019 (CN) .......................... 201910436801.5

(51) Int. Cl.
*G06F 9/48* (2006.01)
*G06F 9/4401* (2018.01)
(Continued)

(52) U.S. Cl.
CPC .......... *G06F 9/4887* (2013.01); *G06F 9/4411* (2013.01); *G06F 9/5072* (2013.01);
(Continued)

(58) Field of Classification Search
None
See application file for complete search history.

(56) References Cited

U.S. PATENT DOCUMENTS

| 5,052,043 A | 9/1991 | Gaborski |
| 6,144,977 A | 11/2000 | Giangarra et al. |

(Continued)

FOREIGN PATENT DOCUMENTS

| CN | 1503858 A | 6/2004 |
| CN | 1503958 A | 6/2004 |

(Continued)

OTHER PUBLICATIONS

Chen, T., et al., "DianNao: A Small-Footprint High-Throughput Accelerator for Ubiquitous Machine-Learning," ASPLOS '14 Proceedings of the 19th international conference on Architectural support for programming languages and operating systems, pp. 269-284, Salt Lake City, Utah, USA—Mar. 1, 2014; available: https://dl.acm.org/citation.cfm?id=2541967.

(Continued)

*Primary Examiner* — Lewis A Bullock, Jr.
*Assistant Examiner* — Melissa A Headly
(74) *Attorney, Agent, or Firm* — Rimon PC

(57) ABSTRACT

The present disclosure discloses a data processing method and related products, in which the data processing method includes: generating, by a general-purpose processor, a binary instruction according to device information of an AI processor, and generating an AI learning task according to the binary instruction; transmitting, by the general-purpose processor, the AI learning task to the cloud AI processor for (Continued)

running; receiving, by the general-purpose processor, a running result corresponding to the AI learning task; and determining, by the general-purpose processor, an offline running file according to the running result, where the offline running file is generated according to the device information of the AI processor and the binary instruction when the running result satisfies a preset requirement. By implementing the present disclosure, the debugging between the AI algorithm model and the AI processor can be achieved in advance.

13 Claims, 9 Drawing Sheets

(51) Int. Cl.
  G06F 9/50        (2006.01)
  G06F 11/36       (2006.01)
(52) U.S. Cl.
  CPC ...... *G06F 11/3644* (2013.01); *G06F 11/3664* (2013.01); *G06F 11/3688* (2013.01); *G06F 11/3692* (2013.01)

(56) References Cited

U.S. PATENT DOCUMENTS

| | | | |
|---|---|---|---|
| 6,223,144 B1 | 4/2001 | Barnett et al. | |
| 6,671,796 B1 | 12/2003 | Sudharsanan et al. | |
| 6,715,065 B1 | 3/2004 | Ebata et al. | |
| 6,931,639 B1 | 8/2005 | Eickemeyer | |
| 7,236,995 B2 | 6/2007 | Hinds | |
| 7,242,414 B1 | 7/2007 | Thekkath et al. | |
| 7,406,451 B2 | 7/2008 | Mrziglod et al. | |
| 7,721,128 B2 | 5/2010 | Johns et al. | |
| 7,945,607 B2 | 5/2011 | Hinds | |
| 8,051,117 B2 | 11/2011 | Lundvall et al. | |
| 8,190,664 B2 | 5/2012 | Lundvall et al. | |
| 8,560,591 B2 | 10/2013 | Lundvall et al. | |
| 8,694,572 B2 | 4/2014 | Samy et al. | |
| 8,762,438 B2 | 6/2014 | Lundvall et al. | |
| 8,924,455 B1 | 12/2014 | Barman et al. | |
| 9,412,366 B2 | 8/2016 | Wilkensky et al. | |
| 10,187,568 B1 | 1/2019 | Tran et al. | |
| 10,224,954 B1 | 3/2019 | Madduri et al. | |
| 10,360,304 B1 | 7/2019 | Alvarez et al. | |
| 10,427,306 B1 | 10/2019 | Quinlan et al. | |
| 10,656,942 B2 | 5/2020 | Madduri et al. | |
| 10,929,744 B2 | 2/2021 | Li et al. | |
| 2002/0138714 A1 | 9/2002 | Leibholz et al. | |
| 2003/0167460 A1 | 9/2003 | Desai et al. | |
| 2005/0138327 A1 | 6/2005 | Tabei | |
| 2006/0161375 A1 | 7/2006 | Duberstein et al. | |
| 2007/0220076 A1 | 9/2007 | Hinds | |
| 2008/0148120 A1 | 6/2008 | Seuring | |
| 2009/0113186 A1 | 4/2009 | Kato et al. | |
| 2009/0125293 A1 | 5/2009 | Lefurgy et al. | |
| 2010/0073068 A1 | 3/2010 | Cho et al. | |
| 2011/0060587 A1 | 3/2011 | Phillips et al. | |
| 2011/0301777 A1 | 12/2011 | Cox et al. | |
| 2012/0284696 A1 | 11/2012 | Koskinen | |
| 2012/0316845 A1 | 12/2012 | Grey et al. | |
| 2013/0054110 A1 | 2/2013 | Sata | |
| 2013/0332610 A1 | 12/2013 | Beveridge | |
| 2014/0081625 A1 | 3/2014 | Wilensky et al. | |
| 2014/0164737 A1 | 6/2014 | Collange et al. | |
| 2014/0249814 A1 | 9/2014 | Nakano et al. | |
| 2015/0134581 A1 | 5/2015 | Doeding et al. | |
| 2015/0339570 A1* | 11/2015 | Scheffler ................. | G06N 3/10 706/27 |
| 2015/0370303 A1 | 12/2015 | Krishnaswamy et al. | |
| 2016/0026231 A1 | 1/2016 | Ignowski et al. | |
| 2016/0054922 A1 | 2/2016 | Awasthi et al. | |
| 2016/0124710 A1 | 5/2016 | Lutz et al. | |
| 2016/0170866 A1 | 6/2016 | Ioualalen et al. | |
| 2016/0328645 A1 | 11/2016 | Lin et al. | |
| 2017/0061279 A1 | 3/2017 | Yang et al. | |
| 2017/0090956 A1 | 3/2017 | Linsky | |
| 2017/0103022 A1 | 4/2017 | Kreinin et al. | |
| 2017/0142327 A1 | 5/2017 | Bayani | |
| 2017/0161604 A1 | 6/2017 | Craddock et al. | |
| 2017/0213156 A1* | 7/2017 | Hammond ................. | G06F 8/31 |
| 2017/0221176 A1 | 8/2017 | Munteanu et al. | |
| 2017/0257079 A1 | 9/2017 | Jain et al. | |
| 2017/0262959 A1 | 9/2017 | Lee et al. | |
| 2017/0316307 A1 | 11/2017 | Koster et al. | |
| 2017/0316312 A1 | 11/2017 | Goyal et al. | |
| 2017/0344882 A1 | 11/2017 | Ambrose et al. | |
| 2017/0353163 A1 | 12/2017 | Gazneli et al. | |
| 2017/0357530 A1 | 12/2017 | Shih et al. | |
| 2017/0357910 A1 | 12/2017 | Sommer et al. | |
| 2018/0046903 A1 | 2/2018 | Yao et al. | |
| 2018/0088996 A1 | 3/2018 | Rossi et al. | |
| 2018/0096243 A1 | 4/2018 | Patil et al. | |
| 2018/0136912 A1 | 5/2018 | Venkataramani et al. | |
| 2018/0157464 A1 | 6/2018 | Lutz et al. | |
| 2018/0288440 A1 | 10/2018 | Chao | |
| 2018/0293517 A1 | 10/2018 | Browne et al. | |
| 2018/0300931 A1 | 10/2018 | Vembu et al. | |
| 2018/0322391 A1 | 11/2018 | Wu et al. | |
| 2018/0357541 A1 | 12/2018 | Chen et al. | |
| 2018/0367729 A1 | 12/2018 | Parasnis et al. | |
| 2018/0373976 A1 | 12/2018 | Woo | |
| 2019/0034784 A1 | 1/2019 | Li et al. | |
| 2019/0042925 A1 | 2/2019 | Choe et al. | |
| 2019/0050710 A1 | 2/2019 | Wang et al. | |
| 2019/0057696 A1 | 2/2019 | Ogawa | |
| 2019/0108443 A1 | 4/2019 | Dwarakanath et al. | |
| 2019/0114142 A1 | 4/2019 | Yoda et al. | |
| 2019/0122094 A1 | 4/2019 | Chen et al. | |
| 2019/0122119 A1 | 4/2019 | Husain | |
| 2019/0138372 A1 | 5/2019 | Tee | |
| 2019/0164285 A1 | 5/2019 | Nye et al. | |
| 2019/0180170 A1 | 6/2019 | Huang et al. | |
| 2019/0199370 A1 | 6/2019 | Madduri et al. | |
| 2019/0205737 A1 | 7/2019 | Bleiweiss et al. | |
| 2019/0205746 A1 | 7/2019 | Nurvitadhi et al. | |
| 2019/0220734 A1 | 7/2019 | Ferdman et al. | |
| 2019/0228762 A1 | 7/2019 | Wang et al. | |
| 2019/0251429 A1 | 8/2019 | Du et al. | |
| 2019/0265949 A1 | 8/2019 | Ito | |
| 2019/0278677 A1 | 9/2019 | Terechko et al. | |
| 2019/0294968 A1 | 9/2019 | Vantrease et al. | |
| 2020/0005424 A1 | 1/2020 | Appu et al. | |
| 2020/0082274 A1* | 3/2020 | Rossi ................. | G06N 3/063 |
| 2020/0097799 A1 | 3/2020 | Divakar et al. | |
| 2020/0117453 A1 | 4/2020 | Zhang et al. | |
| 2020/0117614 A1 | 4/2020 | Zhang et al. | |
| 2020/0125508 A1 | 4/2020 | Liu et al. | |
| 2020/0126554 A1 | 4/2020 | Chen et al. | |
| 2020/0126555 A1 | 4/2020 | Chen et al. | |
| 2020/0142748 A1 | 5/2020 | Liu et al. | |
| 2020/0159527 A1 | 5/2020 | Zhang et al. | |
| 2020/0159530 A1 | 5/2020 | Zhang et al. | |
| 2020/0159531 A1 | 5/2020 | Zhang et al. | |
| 2020/0159532 A1 | 5/2020 | Zhang et al. | |
| 2020/0159533 A1 | 5/2020 | Zhang et al. | |
| 2020/0159534 A1 | 5/2020 | Li et al. | |
| 2020/0160162 A1 | 5/2020 | Zhang et al. | |
| 2020/0160163 A1 | 5/2020 | Liu et al. | |
| 2020/0160219 A1 | 5/2020 | Zhang et al. | |
| 2020/0160220 A1 | 5/2020 | Zhang et al. | |
| 2020/0160221 A1 | 5/2020 | Zhang et al. | |
| 2020/0160222 A1 | 5/2020 | Zhang et al. | |
| 2020/0168227 A1 | 5/2020 | Chen et al. | |
| 2020/0174547 A1 | 6/2020 | Fang et al. | |
| 2020/0183752 A1 | 6/2020 | Liu et al. | |
| 2020/0241874 A1 | 7/2020 | Chen et al. | |
| 2020/0257972 A1 | 8/2020 | Miniskar et al. | |
| 2020/0334041 A1 | 10/2020 | Zhang et al. | |
| 2020/0334522 A1 | 10/2020 | Zhang et al. | |
| 2020/0334572 A1 | 10/2020 | Zhang et al. | |
| 2020/0394522 A1 | 12/2020 | Liu et al. | |

(56) References Cited

U.S. PATENT DOCUMENTS

| | | |
|---|---|---|
| 2020/0394523 A1 | 12/2020 | Liu et al. |
| 2021/0042889 A1 | 2/2021 | Pei |
| 2021/0061028 A1 | 3/2021 | Da Deppo et al. |
| 2021/0117768 A1 | 4/2021 | Liu et al. |
| 2021/0117810 A1 | 4/2021 | Liu |
| 2021/0182177 A1 | 6/2021 | Su et al. |
| 2021/0264270 A1 | 8/2021 | Liu et al. |
| 2021/0334007 A1 | 10/2021 | Liu et al. |
| 2021/0334137 A1 | 10/2021 | Zhang et al. |
| 2021/0341989 A1 | 11/2021 | Chen et al. |
| 2021/0374510 A1 | 12/2021 | Liu et al. |
| 2021/0374511 A1 | 12/2021 | Liu et al. |

FOREIGN PATENT DOCUMENTS

| | | |
|---|---|---|
| CN | 1851668 A | 10/2006 |
| CN | 101572829 A | 11/2009 |
| CN | 102270042 A | 12/2011 |
| CN | 102404673 A | 4/2012 |
| CN | 102684701 A | 9/2012 |
| CN | 102761509 A | 10/2012 |
| CN | 102789413 A | 11/2012 |
| CN | 102903089 A | 1/2013 |
| CN | 102981854 A | 3/2013 |
| CN | 103152673 A | 6/2013 |
| CN | 103268272 A | 8/2013 |
| CN | 104914977 A | 9/2015 |
| CN | 105389158 A | 3/2016 |
| CN | 105550222 A | 5/2016 |
| CN | 105653790 A | 6/2016 |
| CN | 103534664 A | 8/2016 |
| CN | 105893419 A | 8/2016 |
| CN | 105978611 A | 9/2016 |
| CN | 106156310 A | 11/2016 |
| CN | 106250981 A | 12/2016 |
| CN | 106354568 A | 1/2017 |
| CN | 106406812 A | 2/2017 |
| CN | 106469291 A | 3/2017 |
| CN | 106485316 A | 3/2017 |
| CN | 106502626 A | 3/2017 |
| CN | 106528489 A | 3/2017 |
| CN | 106570559 A | 4/2017 |
| CN | 106650922 A | 5/2017 |
| CN | 106814639 A | 6/2017 |
| CN | 106951587 A | 7/2017 |
| CN | 106951962 A1 | 7/2017 |
| CN | 106997236 A | 8/2017 |
| CN | 107003988 A | 8/2017 |
| CN | 107025629 A | 8/2017 |
| CN | 107368174 A | 11/2017 |
| CN | 107451654 A | 12/2017 |
| CN | 107451658 A | 12/2017 |
| CN | 107577008 A | 1/2018 |
| CN | 107578014 A | 1/2018 |
| CN | 107608715 A | 1/2018 |
| CN | 107644254 A | 1/2018 |
| CN | 107688855 A | 2/2018 |
| CN | 107797913 A | 3/2018 |
| CN | 107942240 A | 4/2018 |
| CN | 108009126 A | 5/2018 |
| CN | 108052934 A | 5/2018 |
| CN | 108053028 A | 5/2018 |
| CN | 104899641 A | 7/2018 |
| CN | 108337000 A | 7/2018 |
| CN | 108510067 A | 9/2018 |
| CN | 108664266 A | 10/2018 |
| CN | 108712630 A | 10/2018 |
| CN | 108717570 A | 10/2018 |
| CN | 108734288 A | 11/2018 |
| CN | 109062540 A | 12/2018 |
| CN | 109063820 A | 12/2018 |
| CN | 109146069 A | 1/2019 |
| CN | 109214281 A | 1/2019 |
| CN | 109343857 A | 2/2019 |
| CN | 109344065 A | 2/2019 |
| CN | 109408500 A | 3/2019 |
| CN | 109478144 A | 3/2019 |
| CN | 109478251 A | 3/2019 |
| CN | 109492241 A | 3/2019 |
| CN | 109902745 A | 6/2019 |
| CN | 109934331 A | 6/2019 |
| CN | 109993296 A | 7/2019 |
| CN | 110059733 A | 7/2019 |
| CN | 11055450 A | 12/2019 |
| CN | 110780845 A | 2/2020 |
| EP | 0 789 296 A1 | 8/1997 |
| EP | 2 703 945 A2 | 3/2014 |
| EP | 3 106 997 A2 | 12/2016 |
| EP | 3396545 A1 | 10/2018 |
| EP | 3 407 268 A1 | 11/2018 |
| JP | H03-075860 | 8/1989 |
| JP | H09-265379 A | 10/1997 |
| JP | 2009-134433 A | 8/2012 |
| JP | 2013-514570 A | 4/2013 |
| JP | 2013514570 A | 4/2013 |
| JP | 2014016830 A | 1/2014 |
| JP | 2014-199464 A | 10/2014 |
| JP | 2015011363 A | 1/2015 |
| JP | 2013514570 A | 4/2015 |
| JP | 2015-176158 A | 10/2015 |
| JP | 2018-26114 A | 2/2018 |
| JP | 201826114 A | 2/2018 |
| JP | 2019-519852 A | 7/2019 |
| JP | 2019519852 A | 7/2019 |
| WO | 1999005851 A2 | 2/1999 |
| WO | 2008153194 A1 | 12/2008 |
| WO | 2014199464 A1 | 12/2014 |
| WO | 2016186823 A1 | 11/2016 |
| WO | 2017138220 A1 | 8/2017 |
| WO | 2017185412 A1 | 11/2017 |
| WO | 2017138220 A1 | 11/2018 |

OTHER PUBLICATIONS

Chen, T., et al., "A Small-Footprint Accelerator for Large-Scale Neural Networks," ACM Transactions on Computer Systems (TOCS), vol. 33, Issue 2, May 1, 2015, Article No. 6, ACM New York, NY, USA; available: https://dl.acm.org/citation.cfm?id=2701417.

Chen, Y., et al., "DaDianNao: A Machine-Learning Supercomputer," MICRO-47 Proceedings of the 47th Annual IEEE/ACM International Symposium on Microarchitecture, pp. 609-622, Cambridge, United Kingdom—Dec. 13, 2014; available: https://dl.acm.org/citation.cfm?id=2742217.

Luo, T., et al., "DaDianNao: A Neural Network Supercomputer," Published in: IEEE Transactions on Computers, vol. 66, Issue: 1, pp. 73-88, Date of Publication: May 30, 2016; available: https://ieeexplore.ieee.org/document/7480791.

Liu, D., et al., "PuDianNao: A Polyvalent Machine Learning Accelerator," ASPLOS '15 Proceedings of the Twentieth International Conference on Architectural Support for Programming Languages and Operating Systems, pp. 369-381, Istanbul, Turkey—Mar. 14, 2015; available: https://dl.acm.org/citation.cfm?id=2694358.

Du, Z., et al., "ShiDianNao: Shifting Vision Processing Closer to the Sensor," ISCA '15 Proceedings of the 42nd Annual International Symposium on Computer Architecture, pp. 92-104, Portland, Oregon—Jun. 13, 2015; available: https://dl.acm.org/citation.cfm?id=2750389.

Du, Z., et al., "An Accelerator for High Efficient Vision Processing," Published in: IEEE Transactions on Computer-Aided Design of Integrated Circuits and Systems, vol. 36, Issue: 2, Jun. 22, 2016, pp. 227-240; available: https://ieeexplore.ieee.org/document/7497562.

Liu, S., et al., "Cambricon: An Instruction Set Architecture for Neural Networks," 2016 ACM/IEEE 43rd Annual International Symposium on Computer Architecture (ISCA), Seoul, South Korea, Jun. 18, 2016; available: https://ieeexplore.ieee.org/document/7551409.

Zhang, S. et al., "Cambricon-X: An Accelerator for Sparse Neural Networks," Published in: 2016 49th Annual IEEE/ACM International Symposium on Microarchitecture (MICRO), Taipei, Taiwan, Oct. 15, 2016; available: https://ieeexplore.ieee.org/document/7783723.

(56) References Cited

OTHER PUBLICATIONS

Chen, Y., et al., "DianNao Family: Energy-Efficient Hardware Accelerators for Machine Learning," Communications of the ACM, vol. 59 Issue 11, Oct. 28, 2016, pp. 105-112, ACM New York, NY, USA; available: https://dl.acm.org/citation.cfm?id=2996864.
Vivienne Sze et al., "Efficient Processing of Deep Neural Networks: A Tutorial and Survey", arxiv.org, Cornell University Library, 201 Olin Library Cornell University Ithaca, NY 14853, Mar. 27, 2017 (Mar. 27, 2017), XP080759895, DOI: 10.1109/JPROC.2017.2761740.
Liu Shaoli et al., "Cambricon: An Instruction Set Architecture for Neural Networks", 2013 21st International Conference on Program Comprehension (ICPC); [International Symposium on Computer Architecture.(ISCA)], IEEE, US, Jun. 18, 2016 (Jun. 18, 2016), pp. 393-405, XP032950675, ISSN: 1063-6897, DOI: 10.1109/ISCA.2016.42 ISBN: 978-0-7695-3174-8 [retrieved on Aug. 24, 2016].
IBM, "PowerPC Microprocessor Family: Vector/SIMD Multimedia Extension Technology Programming Environments Manual Programming Environments Manual", Aug. 22, 2005 (Aug. 22, 2005), pp. 170-171, XP055673033, Retrieved from the Internet: URL:http://math-atlas.sourceforge.net/devel/assembly/ vector_simd_pem. ppc.2005AUG23.pdf [retrieved on Mar. 3, 2020].
Sumod Mohan, "Accuracy and Multi-Core Performance of Machine Learning Algorithms for Handwritten Character Recognition", Aug. 1, 2009 (Aug. 1, 2009), XP055673941, Retrieved from the Internet: URL:https://tigerprints.clemson.edu/cgi/viewcontent.cgi? article=1634&context=all theses retrieved on Mar. 5, 2020].
European Patent Office, Extended European Search Report for European Application No. 19212749.6 dated Mar. 18, 2020.
European Patent Office, Extended European Search Report for European Application No. 19212750.4 dated Mar. 18, 2020.
European Patent Office, Extended European Search Report for European Application No. 19212751.2 dated Mar. 18, 2020.
European Patent Office, Extended European Search Report for European Application No. 19212752.0 dated Mar. 18, 2020.
European Patent Office, Extended European Search Report for European Application No. 19214004.4 dated Mar. 18, 2020.
European Patent Office, Extended European Search Report for European Application No. 19213389.0 dated Mar. 18, 2020.
European Patent Office, Extended European Search Report for European Application No. 19212753.8 dated Mar. 18, 2020.
European Patent Office, Extended European Search Report for European Application No. 19212754.6 dated Mar. 18, 2020.
European Patent Office, Extended European Search Report for European Application No. 19212755.3 dated Mar. 18, 2020.
European Patent Office, Extended European Search Report for European Application No. 19212756.1 dated Mar. 18, 2020.
European Patent Office, Extended European Search Report for European Application No. 18906652.6 dated Mar. 18, 2020.
European Patent Office, Extended European Search Report for European Application No. 19212746.2 dated Mar. 18, 2020.
Kalathingal Sajith et al., "Dynamic Inter-Thread Vectorization Architecture: Extracting OLP from TLP", 2016 28th International Symposium on Computer Architecture and High Performance Computing (SBAC-PAD), IEEE, Oct. 26, 2016, pp. 18-25, XP033028005, DOI: 10.1109/SBAC-PAD.2016.11.
Li et al., "Using Artificial Neural Network for Predicting Thread Partitioning in Speculative Multithreading", IEEE, 2015, pp. 823-826.
Na et al., "Speeding up Convolutional Neural Network Training with Dynamic Precision Scaling and Flexible MultiplierAccumulator", Section 2 Proposed Approach: Concept, ACM, Aug. 8-10, 2016, 6 pages.

Hanlon, Jamie, "Why is so much memory needed for deep neural networks?", URL: https://www.graphcore.ai/posts/why-is-so-much-memory-needed-for-deep-neural-networks, Jan. 31, 2017, 6 pages.
Anonymous, "Control unit—Wikipedia", May 8, 2017 (May 8, 2017), XP055673879,Retrieved from the Internet: URL: https://web.archive.org/web/20170508110348/https://en.wikipedia.org/ wiki/ Control unit [retrieved on Mar. 5, 2020].
Joel Emer et al., "DNN Accelerator Architectures", CICS/MTL Tutorial, Jan. 1, 2017 (Jan. 1, 2017), XP055672691, Retrieved from the Internet: URL:https://www.rle.mit.edu/eems/wp-content/uploads/2017/031Tutorial-on- JNN-4-of-5-DNN-Accelerator-Architectures.pdf [retrieved on Mar. 2, 2020].
Chen Yu-Hsin et al., "Eyeriss: An Energy-Efficient Reconfigurable Accelerator for Deep Convolutional Neural getworks", IEEE Journal of Solid-State Circuits, IEEE, USA, vol. 52, No. 1, Jan. 1, 2017 (Jan. 1, 2017), pp. 127-138, XP011638633, ISSN: 0018-9200, DOI: 10.1109/JSSC.2016.2616357 [retrieved on Jan. 9, 2017].
Pedro O. Domingos, et al., "An Efficient and Scalable Architecture for Neural Networks With Backpropagation Learning" Proceedings/ 2005 International Conference on Field Programmable Logic and Applications {FPL): Tampere Hall, Tampere, Finland, Jan. 1, 2005, pp. 89-94, XP055606447, Piscataway, NJ. DOI: 10.1109/FPL.2005.1515704 ISBN: 978-0-7803-9362-2.
Hsu Jeremy, "For sale: deep learning [News]", IEEE Spectrum, IEEE Inc. New York, US, vol. 53, No. 8, Aug. 1, 2016 (Aug. 1, 2016), pp. 12-13, XP011620787, ISSN: 0018-9235, DOI: 10.1109/MSPEC.2016.7524158 [retrieved on Jul. 27, 2016].
Song Mingcong et al., "In-Situ AI: Towards Autonomous and Incremental Deep Learning for IoT Systems", 2018 IEEE International Symposium on High Performance Computer Architecture (HPCA),IEEE, Feb. 24, 2018 (Feb. 24, 2018), pp. 92-103, XP033341941, DOI: 10.1109/HPCA.2018.00018 [retrieved on Mar. 27, 2018].
Kallam Suresh et al., "Evaluating the Performance of Deep Learning Techniques on Classification Using Tensor Flow Application", 2018 International Conference on Advances in Computing and Communication Engineering (ICACCE). IEEE, Jun. 22, 2018 (Jun. 22, 2018), pp. 331-335, XP033389370, DOI: 10.1109/ICACCE.2018.844167 4 [retrieved on Aug. 20, 2018].
Olariu Cristian et al., "A Cloud-Based AI Framework for Machine Learning Orchestration: A "Driving or Not-Driving" Case-Study for Self-Driving Cars", 2019 IEEE Intelligent Vehicles Symposium (IV). IEEE, Jun. 9, 2019 (Jun. 9, 2019), pp. 1715-1722, XP033606002, DOI: 10.1109/IVS.2019.8813870 [retrieved on Aug. 26, 2019].
European Patent Office, extended European search report for Application No. 19216754.2 dated May 8, 2020.
Extended European Search Report for EP Application No. 19214324.6 dated Oct. 1, 2020.
International Searching Authority, International Search Report for PCT Application No. PCT/CN2019/093144 dated Oct. 9, 2019.
Extended European Search Report for Application No. 19215861.6 dated May 15, 2020.
Extended European Search Report for Application No. 19215862.4 dated May 15, 2020.
Sumina Yamashita, et al., "A Method to create illustrate images using DCGAN," JISJ SIG Technical Report, vol. 2017-MPS-112 No. 16, Feb. 27, 2017; translation of abstract included.
Korean Office Action, Application No. 10-2019-7037882; 4 pages; dated Dec. 28, 2022.
A Framework for Algorithm Deployment on Cloud-based Quantum Computers; arxiv.org, Cornell University Library, 201 Olin Library Cornell University Ithaca, NY 14853, Dated Oct. 24, 2018; pp. 1-10.

\* cited by examiner

DATA PROCESSING METHOD AND RELATED PRODUCTS

RELATED APPLICATIONS

This application is a national stage application of PCT/CN2019/096859, filed Jul. 19, 2019, which claims the benefit of priority from Chinese Application No. 201910436801.5, filed May 23,2019, and Chinese Application No. 201910315962.9, filed Apr. 18, 2019, the disclosures of which are incorporated herein by reference in their entirety.

RELATED APPLICATIONS

The present application claims priority to: Chinese Patent Application No. 201910315962.9 with the title of "Data Processing Method and Related Products" and filed on Apr. 18, 2019;

The present application claims priority to: Chinese Patent Application No. 201910436801.5 with the title of "Data Processing Method and Related Products" and filed on May 23, 2019.

The content of the aforementioned applications are herein incorporated by reference in their entireties.

TECHNICAL FIELD

The disclosure relates generally to artificial intelligence processor technologies, and more specifically to a data processing method and related products.

BACKGROUND

In the prior art, only after an artificial intelligence (AI) processor has successfully taped out can an algorithm application developer start developing and testing AI algorithms on the AI processor hardware.

As a result, the functional and performance result of the AI algorithm developed for the AI processor can be obtained only after the AI processor has taped out. There is an urgent problem pertaining to how debugging is carried out between an AI algorithm model and the AI processor, when the AI processor has not taped out yet.

SUMMARY

The embodiments of the present disclosure provide a data processing method and related products. It doesn't matter whether an AI processor has taped out or not. The technical solutions disclosed herein facilitate debugging between an AI algorithm model and the AI processor before and after the tape-out.

To that purpose, in some embodiments, the present disclosure proposes a data processing method applied to a data processing system that includes a general-purpose processor and a cloud AI processing platform or system. The general-purpose processor generates a binary instruction or binary instructions according to the device information of the AI processor, generates an AI learning task according to the binary instruction, and transmits the AI learning task to the cloud AI processing platform or system (herein referred to as "cloud AI processing system") for running. The cloud AI processor receives and then executes the AI learning task to generate a running result. The general-purpose processor receives the running result corresponding to the AI learning task, and determines an offline running file according to the running result. The offline running file is generated according to the device information of the AI processor and the binary instruction when the running result satisfies a preset requirement.

The device information includes hardware architecture information and parameters of running environment of the AI processor.

The parameters of running environment include at least one of a base clock speed of the AI processor, an access bandwidth of an off-chip memory and the AI processor, a size of an on-chip memory, the number of the cores of the AI processor, and a type of an operating unit of the AI processor.

Optionally, the data processing method further includes: receiving, by the general-purpose processor, the device information of the AI processor.

Optionally, the data processing method further includes: writing, by the general-purpose processor, the device information into a driver to select a well-matched Cloud AI processor based on the device information in the driver.

Optionally, the determining the offline running file according to the running result includes:

if the running result satisfies a preset requirement, generating the corresponding offline running file according to the binary instruction that satisfies the preset requirement.

Optionally, the determining the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

Optionally, the steps of optimizing the AI learning task include:

optimizing the AI learning task by a special programming language, optimizing the AI learning task by updating the version of the AI learning task, and adjusting the AI algorithm model.

Optionally, the running result includes one or more pieces of information of whether running time of the AI learning task on the cloud AI processor satisfies a first expectation, whether load information of a cloud AI processing system when the AI learning task is executed satisfies a second expectation, and whether the result of the AI learning task satisfies a third expectation.

Optionally, the cloud AI processor includes at least one of a hardware entity of the AI processor, a field programmable gate array, and a simulator.

Optionally, the hardware entity of the AI processor is an AI processor with a reconfigurable architecture.

It is noted that in the present disclosure, the term "a binary instruction" refers to one or more binary instructions or a binary instruction set. The term "general-purpose processor" refers to any computing device that includes a general-purpose processor. The computing device may include other computing components, storage media, input/output devices, and other hardware parts such as transceivers. The term "cloud AI processing system" may refer to a single AI processor or multiple AI processors that can be configured to execute AI tasks such as machine-learning tasks. It is well understood that a cloud AI processor may also include other necessary hardware components to facilitate AI task computation.

It is also noted that the methods disclosed herein can be used to test software modules, computing algorithms for an AI processor without relying on the AI processor hardware. Therefore, the methods disclosed herein can be used to test or debug software for an AI processor that has not taped out yet. The term "AI processor" may refer to an actual AI processor that is being tested or an AI processor model that is still being designed.

In some embodiments, the present disclosure provides a data processing device including a memory, a general-purpose processor, and a cloud AI processor. The memory is configured to store a computer program running on the general-purpose processor and/or the cloud AI processor.

The general-purpose processor is configured to generate a binary instruction according to the device information of the AI processor, generate an AI learning task according to the binary instruction, and transmit the AI learning task to the cloud AI processor for running.

The cloud AI processor is configured to receive and execute the AI learning task, and then generate a running result. The general-purpose processor is configured to receive the running result corresponding to the AI learning task, and determine an offline running file according to the running result. The offline running file is generated according to the device information of the AI processor and the binary instruction when the running result satisfies a preset requirement.

Optionally, the device information includes hardware architecture information and parameters of running environment of the AI processor.

Optionally, the parameters of running environment include at least one of a base clock speed of the AI processor, an access bandwidth of an off-chip memory and the AI processor, a size of an on-chip memory, the number of the cores of the AI processor, and a type of an operating unit of the AI processor.

Optionally, the general-purpose processor is further configured to:
receive the device information of the AI processor.

Optionally, the general-purpose processor is further configured to:
write the device information into a driver to select a well-matched Cloud AI processor based on the device information in the driver.

Optionally, the general-purpose processor is configured to determine the offline running file according to the running result, which includes:
if the running result satisfies a preset requirement, the general-purpose processor is configured to generate the corresponding offline running file according to the binary instruction that satisfies the preset requirement.

Optionally, the general-purpose processor is further configured to determine the offline running file according to the running result, which includes:
if the running result does not satisfy the preset requirement, the general-purpose processor is configured to execute at least one of the optimization manners in the following process until the running result satisfies the preset requirement, and generate the corresponding offline running file according to the binary instruction that satisfies the preset requirement, where the optimization manners include: adjusting the hardware architecture information of the AI processor, adjusting the parameters of running environment of the AI processor, or optimizing the AI learning task.

Optionally, steps of optimizing the AI learning task include:
optimizing the AI learning task by a special programming language,
optimizing the AI learning task by updating the version of the AI learning task, and
adjusting the AI algorithm model.

Optionally, the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

Optionally, the cloud AI processor includes at least one of a hardware entity of the AI processor, a field programmable gate array, and a simulator.

Optionally, the hardware entity of the AI processor is an AI processor with a reconfigurable architecture.

In some embodiments, the present disclosure provides a data processing method applied to a general-purpose processor. The data processing method includes:
generating, by the general-purpose processor, a binary instruction according to device information of the AI processor, and generating an AI learning task according to the binary instruction;
transmitting, by the general-purpose processor, the AI learning task to the cloud AI processor for running;
receiving, by the general-purpose processor, a running result corresponding to the AI learning task; and
determining, by the general-purpose processor, an offline running file according to the running result; where the offline running file is generated according to the device information of the AI processor and the binary instruction when the running result satisfies a preset requirement.

Optionally, the device information includes hardware architecture information and parameters of running environment of the AI processor.

Optionally, the parameters of running environment include at least one of a base clock speed of the AI processor, an access bandwidth of an off-chip memory and the AI processor, a size of an on-chip memory, the number of the cores of the AI processor, and a type of an operating unit of the AI processor.

Optionally, the data processing method further includes:
receiving, by the general-purpose processor, the device information of the AI processor.

Optionally, the data processing method further includes:
writing, by the general-purpose processor, the device information into a driver to select a well-matched Cloud AI processor based on the device information in the driver.

Optionally, the determining the offline running file according to the running result includes:
if the running result satisfies a preset requirement, generating the corresponding offline running file according to the binary instruction that satisfies the preset requirement.

Optionally, the determining the offline running file according to the running result further includes:
if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

Optionally, steps of optimizing the AI learning task include:

optimizing the AI learning task by a special programming language, optimizing the AI learning task by updating the version of the AI learning task, and adjusting the AI algorithm model.

Optionally, the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

In some embodiments, the present disclosure provides a data processing device including a memory and a general-purpose processor, where a computer program running on the general-purpose processor is stored in the memory, and the data processing method realized by the general-purpose processor when executing the computer program includes:

generating a binary instruction according to device information of the AI processor, and generating an AI learning task according to the binary instruction;

transmitting the AI learning task to the cloud AI processor for running;

receiving a running result corresponding to the AI learning task; and determining an offline running file according to the running result; wherein the offline running file is generated according to the device information of the AI processor and the binary instruction when the running result satisfies a preset requirement.

Optionally, the device information includes the hardware architecture information and the parameters of running environment of the AI processor.

Optionally, the parameters of running environment include at least one of a base clock speed of the AI processor, an access bandwidth of an off-chip memory and the AI processor, a size of an on-chip memory, the number of the cores of the AI processor, and a type of an operating unit of the AI processor.

Optionally, the data processing flow implemented when the general-purpose processor executes the computer program further includes:

receiving the device information of the AI processor.

Optionally, the data processing flow implemented when the general-purpose processor executes the computer program further includes:

writing the device information into the driver to select the well-matched Cloud AI processor according to the device information in the driver.

Optionally, the data processing flow implemented when the general-purpose processor executes the computer program to determine the offline running file according to the running result includes:

if the running result satisfies the preset requirement, generating the corresponding offline running file according to the binary instruction that satisfies the preset requirement.

Optionally, the data processing flow implemented when the general-purpose processor executes the computer program to determine the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

Optionally, the data processing flow implemented when the general-purpose processor optimizes the AI learning task includes:

optimizing the AI learning task by a special programming language, optimizing the AI learning task by updating the version of the AI learning task, and adjusting the AI algorithm model.

Optionally, the running result includes one or more pieces of information of whether the running time of the AI learning task on the cloud AI processor satisfies the expectation, whether load information of a cloud AI processing system when the AI learning task is executed satisfies the expectation, and whether the result of the AI learning task satisfies the expectation.

In some embodiments, the present disclosure provides a data processing method applied to a cloud AI processor, and the data processing method includes:

receiving an AI learning task, where the AI learning task is determined according to the binary instruction generated based on the device information of the AI processor; and executing the AI learning task to generate a running result.

Optionally, the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

Optionally, the cloud AI processor includes at least one of a hardware entity of the AI processor, a field programmable gate array, and a simulator.

Optionally, the cloud AI processor is an AI processor with a reconfigurable architecture.

In some embodiments, the present disclosure provides an AI processor including:

a receiving module configured to receive the AI learning task, where the AI learning task is determined according to the binary instruction generated based on the device information of the AI processor; and an executing module configured to execute the AI learning task to generate the running result.

Optionally, the running result generated by the executing module includes at least one of pieces of information of whether the running time of the AI learning task on the cloud AI processor satisfies the first expectation, whether load information of a cloud AI processing system when the AI learning task is executed satisfies the second expectation, and whether the result of the AI learning task satisfies the third expectation.

Optionally, the cloud AI processor includes at least one of a hardware entity of the AI processor, a field programmable gate array, and a simulator.

Optionally, the cloud AI processor is an AI processor with a reconfigurable architecture.

In some embodiments, the present disclosure provides a data processing method applied to an AI processor, and the data processing method includes:

obtaining an offline running file, where the offline running file is generated according to the device information of the AI processor and the binary instruction when the running result satisfies the preset requirement.

Optionally, the data processing method further includes:

transmitting request information, where the request information includes the device information of the AI processor.

Optionally, the device information includes the hardware architecture information and the parameters of running environment of the AI processor.

Optionally, the parameters of running environment include at least one of a base clock speed of the AI processor, an access bandwidth of an off-chip memory and the AI processor, a size of an on-chip memory, the number of the cores of the AI processor, and a type of an operating unit of the AI processor.

In some embodiments, the present disclosure provides an AI processor including:

a file-obtaining module configured to obtain the offline running file, where the offline running file is generated according to the device information of the AI processor and the binary instruction when the running result satisfies the preset requirement.

Optionally, the AI processor further includes:

a transmitting module configured to transmit request information, where the request information includes the device information of the AI processor.

Optionally, the device information includes the hardware architecture information and the parameters of running environment of the AI processor.

Optionally, the parameters of running environment include at least one of a base clock speed of the AI processor, an access bandwidth of an off-chip memory and the AI processor, a size of an on-chip memory, the number of the cores of the AI processor, and a type of an operating unit of the AI processor.

The technical solutions of the present disclosure have the following technical effects:

(1) the present disclosure provides a software development platform on which the users can test and debug the function, performance and accuracy of algorithms developed for an AI processor against the AI processor; and (2) the offline running file generated after the debugging is completed can be deployed on multiple SoC (system on chip) chips of compatible architectures.

In this way, users can debug the function, performance and accuracy of the algorithm against the AI processor in advance without getting the hardware entity, which greatly shortens the product development cycle. Moreover, there is no need to develop or select a well-matched development environment separately for each SoC chip.

BRIEF DESCRIPTION OF THE DRAWINGS

In order to more clearly illustrate the technical solutions of the embodiments of the present disclosure, the drawings used in the embodiments will be briefly introduced below. The drawings in the following description only refer to some embodiments of the present disclosure, and are not intended to limit the disclosure.

DETAILED DESCRIPTION OF THE EXAMPLES

Figure 1:
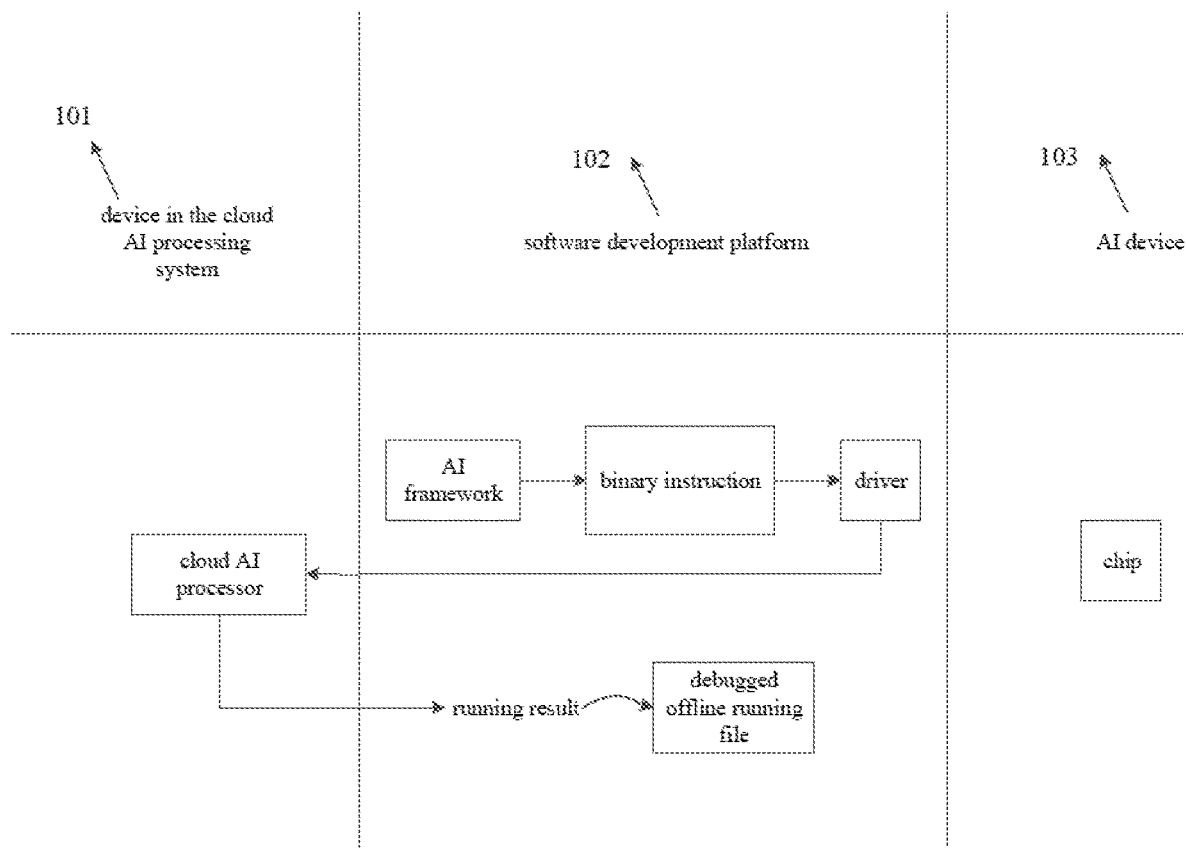
FIG. 1 is a system architecture diagram of the technical solution.

The technical solutions in the embodiments of the present disclosure will be described clearly and in details hereinafter with reference to the accompanied drawings. The embodiments of the present disclosure and the various features and advantageous details of the embodiments are described with reference to the non-limiting embodiments shown in the drawings and in the following description. It should be noted that the features shown in the drawings are not necessarily drawn to scale. The disclosure does not describe the known materials, components, and process techniques so as not to obscure the embodiments of the present disclosure. The examples given are intended only to facilitate the understanding of the implementation of the embodiments of the present disclosure and further enable those skilled in the art to implement the embodiments. These examples should not be construed as limiting the scope of the present disclosure.

Unless otherwise specifically defined, the technical or scientific terms used in this disclosure shall have a general meaning understood by a person of general skill in the field to which this disclosure belongs. The terms such as "first", "second" and the like of the present disclosure are used for distinguishing between different components rather than describing a particular order, quantity or importance. In addition, in each embodiment of the present disclosure, the same or similar reference label represents the same or similar component.

To facilitate better understanding of the technical solutions disclosed herein, the technical terms involved in the embodiments of the present disclosure are first explained below.

Tape-out: in a field of integrated circuit design, tape-out refers to trial production, that is, after the design of integrated circuits that meet preset functions is finished, several or dozens of integrated circuits are first produced for testing. This is called trial production. If during trial production the integrated circuits meets the test requirements, mass production is then carried out to mass produce the new ICs.

Figure 2:
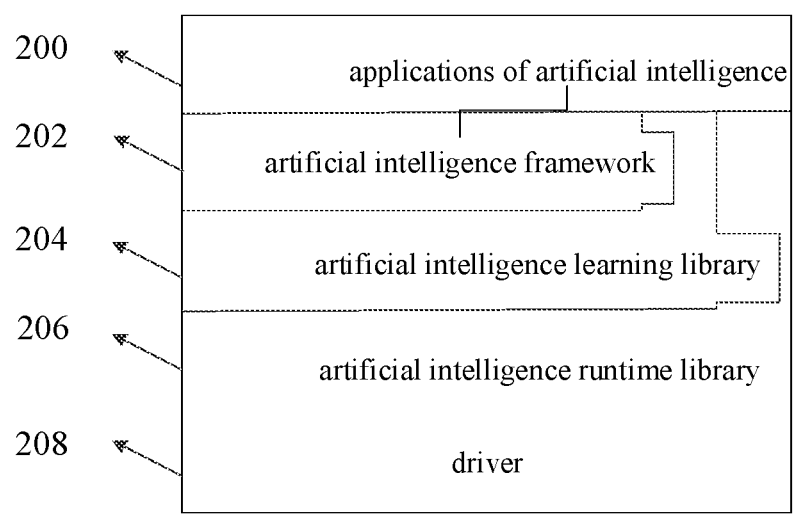
FIG. 2 is a structural diagram of a software stack of an AI processor.

A software stack of an AI processor: referring to FIG. 2, a software stack 20 includes an AI application 200, an AI framework 202, an AI learning library 204, an AI runtime library 206, and a driver 208.

Next, a structure of the software stack is described in detail. The AI application 200 corresponds to different application examples or use cases, and provides a corresponding AI algorithm model, where the algorithm model can be directly parsed by a programming interface of the AI framework 202. In a possible implementation, the AI algorithm model is converted into a binary instruction or a set of binary instructions by the AI learning library 204, and the AI runtime library 206 is called to convert the binary instruction into an AI learning task, where the AI learning task is placed in a task queue, and is called by the driver 208, and then executed by an underlying AI processor. In another possible implementation, the AI runtime library 206 may be also directly called to run the offline running file that have been previously generated by freezing, which could reduce the overhead of intermediate software modules and improve operating efficiency.

A binary instruction: information that can be recognized, i.e., read and understood, by the underlying AI processor. Herein in the present disclosure, a binary instruction may refer to a set of binary instructions.

An AI processor: also referred to as a dedicated processor, which is a processor designed specifically for a particular application or field, for example, a Graphics Processing Unit (GPU). A GPU is also called a display core, a visual processor, a display chip. GPU is a dedicated processor designed for image processing on personal computers, workstations, game consoles and some mobile devices (such as tablets and smartphones). For another example, a Neural Processing Unit (NPU) is a dedicated processor designed for matrix multiplication in the field of AI. NPU adopts an architecture of "data-driven parallel computing" and is particularly efficient at processing massive amounts of multimedia data of videos and images.

A reconfigurable architecture: if an AI processor can utilize reusable hardware resources and flexibly change its architecture according to different application requirements to provide an architecture for each specific application requirement, then this AI processor is called a reconfigurable computing system, and the architecture of this AI processor is called a reconfigurable architecture.

A dedicated programming language: a high-level programming language developed for a specific hardware platform, for example: Cuda C.

Specific embodiments of a data processing method and related products provided by the present disclosure will be described in detail below with reference to the accompanying drawings.

In the prior art, an algorithm application developer can only carry out adaptation and debugging between the AI algorithm model and that AI processor for which the AI algorithm model is developed after the corresponding hardware of the AI processor becomes available. In the prior art, debugging between the chip that has not been taped out and the algorithm is not possible. Extra time after the tape-out is required to complete the adaptation between the algorithm model and the chip. As a result, product release is often delayed, and market opportunities are likely to be missed.

In order to solve the above problems, the present disclosure provides a technical solution in which, regardless of whether the AI processor has taped out or not, a well-matched AI processor is selected from a cloud processing system to simulate the AI processor according to the device information of the AI processor. The software development platform executes a series of processes on the algorithm model provided by the user to obtain a corresponding AI learning task. The AI learning task is sent to run on the cloud AI processor to obtain a running result. The AI learning task can be adjusted or optimized on the software development platform according to the running result. Optimization of the AI learning task may include adjusting the AI algorithm model, optimizing the AI learning library, and adjusting the device information of the AI processor. Through testing and optimization, integration between the AI processor and the AI algorithm model can be achieved.

FIG. 1 is a system architecture diagram of the technical solution. As shown in FIG. 1, the system architecture includes a device 101 that is located remotely, for example, in a cloud processing platform or system. The system architecture further includes a software development platform 102 and a device 103. The device 103 may be an actual AI processor against which some software or computational algorithm developed is being tested. The device 103 may also be an AI processor model against which some software or computational algorithm is concurrently being designed and tested.

Figure 3:
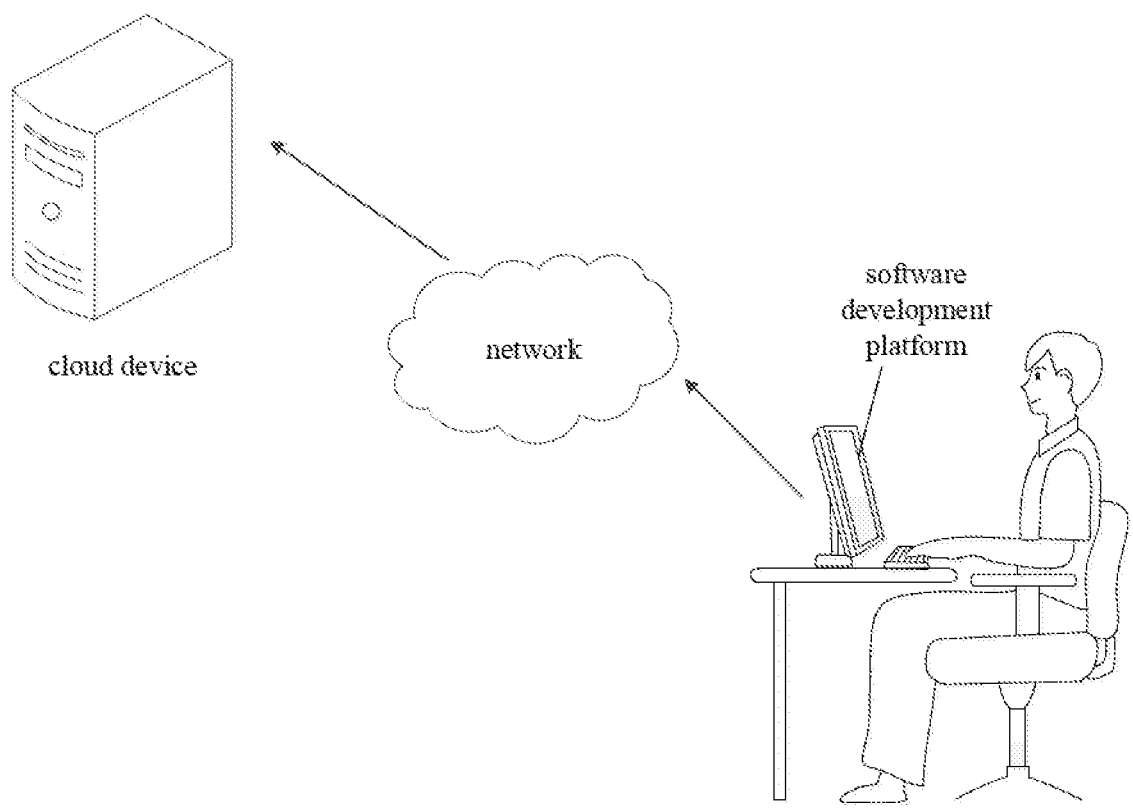
FIG. 3 is a diagram of an embodiment of the technical solution.
Figure 4:
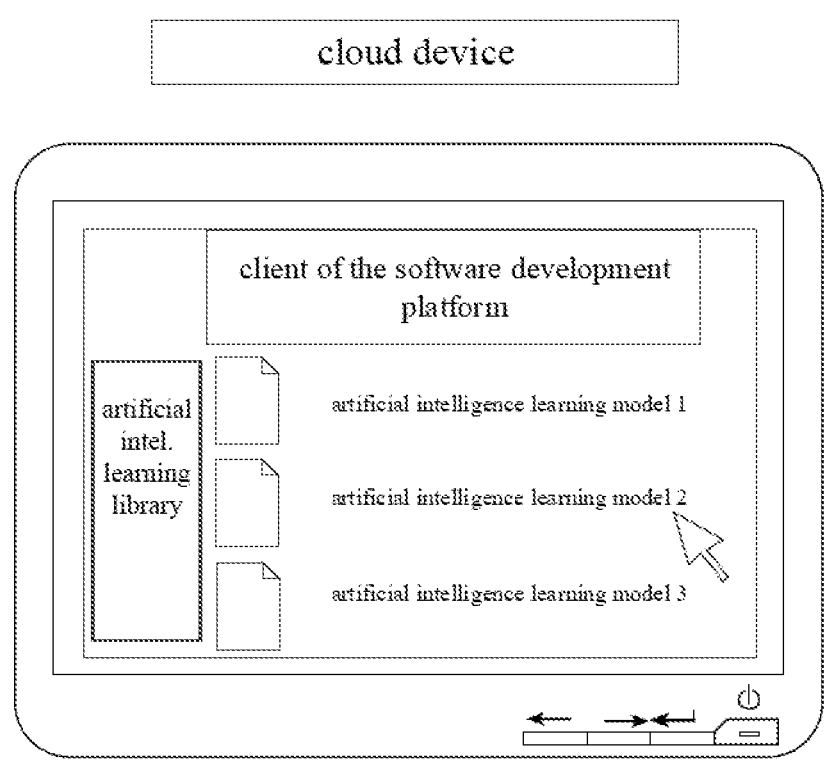
FIG. 4 is another diagram of an embodiment of the technical solution.

In one exemplary implementation, the software development platform 102 provides a series of toolkits for application development, performance tuning, function debugging, and the like. Examples of an application development tool include an AI learning library, an AI runtime library, a compiler, and a software development tool for specific application (such as video analysis). A function debugging tool can meet debugging requirements at different levels such as in a programming framework or in an AI learning library. Examples of a performance tuning tool include a performance profiling tool and a system monitoring tool. Examples of a compiler include a traditional C++ compiler as well as a machine learning compiler based on the C-like languages, or a machine learning compiler based on other high-level languages or domain specific languages that are designed specifically for a domain or field. Optionally, the software development platform may run on a processor of the device 101 in a cloud processing platform, or run on a processor of a host computer device including a general-purpose processor (such as CPU) and displays, etc., which is not specifically limited herein. Furthermore, the software development platform may run, as an end-user, on the host computer device or the cloud device, which is not specifically limited herein. As shown in FIG. 3, this figure schematically shows one of the embodiments of the technical solutions disclosed herein. Users log into the software development platform on a desktop computer, generate the AI learning task corresponding to the algorithm model on the software development platform, and adjust the AI learning task according to the running result of the AI learning task that is executed on the cloud AI processor. As shown in FIG. 4, this figure schematically shows another embodiment of the technical solutions disclosed herein. An AI software development client is set up on the device 101 in a cloud processing platform. In one embodiment, the device 101 is a computer system that includes a general-purpose processor and at least one AI processor. For example, the at least one AI processor may include eight clusters, each of which includes four AI processor cores. In practice, the software development platform 102 maintains user records stored by means of a data block or the like, and the user records include users' personal information (account information, etc.) and service information requested by the users. The service information includes, but is not limited to, debugging requirements, device information of the AI processor. The debugging requirements include, but are not limited to, functional debugging and performance debugging. The device information includes, but is not limited to, hardware architecture information and parameters of the running environment of the AI processor. The parameters of the running environment include, but are not limited to, the base clock speed of the AI processor, the access bandwidth of the off-chip memory, the size of the on-chip memory, the number of cores of the AI processor, and the type of the operating units of the AI processor.

In one implementation, the device 101 is provided with an AI processor. Examples of AI processors may include, but is not limited to, AI processor chip, field programmable gate array, and simulators. Artificial intelligence processor chip may be a reconfigurable chip or a non-reconfigurable chip. In some embodiments, the device 101 may be a server board or a cluster of server boards.

In one implementation, the device 103 may be a terminal device, such as a tablet or a mobile phone. The device 103 may also be an edge device, such as a camera. The device 103 may include an actual AI processor. In some embodiments, the device 103 may be an AI processor that is still in the design stage and has not been taped out.

A working principle of the technical solutions is described as follows. On the software development platform 102, a driver selects, from the device 101, an AI processor that matches the device information of the AI processor in the device 103. The device 101 is a cloud processor or platform. One of the selection criteria is that the hardware architecture of the selected cloud AI processor should be compatible with the hardware architecture information of the AI processors in the device 103. Another one of the selection criteria is that the instruction set of the cloud AI processor should be compatible with the instruction set of the AI processor. For example, the hardware architecture information of the cloud AI processor is compatible with the hardware architecture information of the AI processor in the device 103 if the computing power of the cloud AI processor is greater than or equal to the computing power of the AI processor.

On the software development platform 102, software parameters corresponding to the compiler interface of the AI learning library are configured according to the device information of the AI processor. Combined with the algorithm model obtained by the programming framework, the compiler interface of the AI learning library that has been configured is invoked to compile and obtain the binary instruction of the corresponding AI processor. The binary instruction is processed by the runtime library to generate the AI learning task, where the AI learning task is placed in a task queue, and will be called by the driver and executed by the cloud AI processor.

After the AI learning task is executed by the cloud AI processor, the running result is fed back to the software development platform 102. Optionally, the software development platform 102 can display the running result. The user may issue an operation instruction based on the running result. The software development platform 102 receives the operation instruction from the user and may adjust the binary instruction according to the user's operation instruction in three different ways. The three ways are as follows: adjusting the hardware architecture information of the AI processor, adjusting the parameters of running environment of the AI processor, and optimizing the AI learning task. The adjusted binary instruction is converted into a corresponding AI learning task, and is put into the task queue. Next, the AI learning task in the task queue is again called by the driver, and executed by the cloud AI processor. This process can be repeated until the running result fed back from the cloud AI processor satisfies an expected condition or requirement.

In the technical solutions disclosed herein, the device information of the AI processor corresponds to the software parameters of the compiler interface of the AI learning library. The software parameters may include more information, such as Ram size, Cache size, whether to pass the Cache, and the like. Since such information is related to an operation field that is allocated when the binary instruction is generated, if the AI algorithm model remains the same, the binary instruction can be adjusted by updating the device information of the AI processor, so that the AI learning task can be adjusted. Regardless of whether the AI processor has taped out or not, the well-matched cloud AI processor selected from the device 101 according to the device information of the AI processor can simulate the AI processor, and the corresponding AI learning task can be executed on the device 101. Using the running result, the users can complete debugging and testing of the function, performance and accuracy of the algorithm model against the AI processor on the software development platform. An offline running file generated after the debugging is completed can be deployed on multiple SoC chips of compatible architectures. In this way, the users can perform testing between the algorithm model and the AI processor in advance without relying on the processor hardware, which will greatly shorten the product development cycle. Moreover, there is no need to develop or select a separate development environment for each SoC chip.

Furthermore, in the technical solutions disclosed herein, the current running environment parameters corresponding to the device information of the cloud AI processor may be the same as the actual running environment parameters, or different from the actual running parameters. According to an execution result of the cloud AI processor executing the specific AI learning task, it may be determined whether the device information of the AI processor satisfies an expected condition. If the device information of the AI processor does not meet the expected condition, the device information of the AI processor may be further adjusted until the device information of the AI processor satisfies the expected condition. Therefore, even when the architecture of an AI processor is still in the design stage, the design specifications of the SoC chip can be assessed using the technical solutions disclosed herein.

Figure 5:
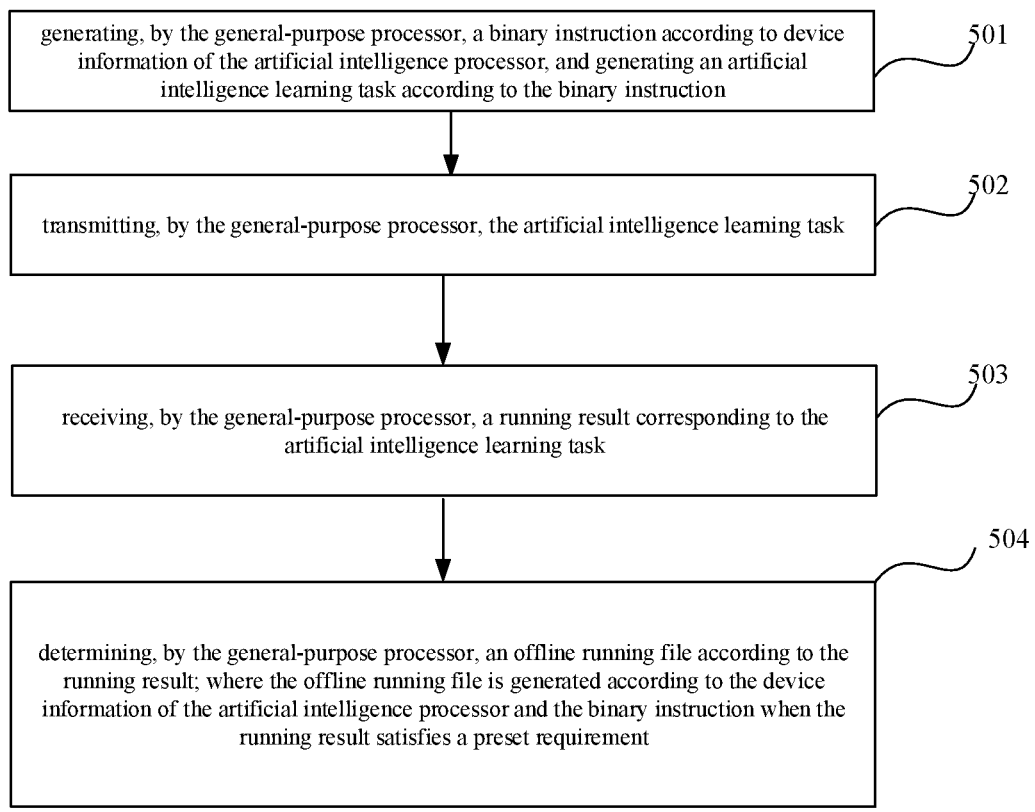
FIG. 5 is a flow chart of a data processing method proposed by the present disclosure.

Based on the above description, FIG. 5 is a flow chart of a data processing method proposed by the present disclosure. The method is applied to the general-purpose processor and corresponds to the software development platform shown in FIG. 1. As described above, the general-purpose processor may be a general-purpose processor in the device 101 of a cloud processing platform or a general-purpose processor of a host computer device. The data processing method includes:

step 501, generating, by the general-purpose processor, the binary instruction according to the device information of the AI processor; and generating, by the general-purpose processor, the AI learning task according to the binary instruction.

In the technical solutions disclosed herein, a plurality of programming frameworks can be integrated in the software development platform 102, for example, the tensor flow AI learning system TensorFlow, the deep learning framework Caffe, Caffe2, MXNet, and the like. Taking Caffe as an example, Caffe has three core modules, namely Blobs, Layers and Nets. Among them, Blobs is configured for data storage, data interaction and data processing. And through Blobs, an interface of data memory can be formulated uniformly. Layers is the core of the neural network and defines many hierarchical structures. Layers treats Blobs as input/output. Nets is a collection of Layers where these layer structures form a network through connection.

For step 501, software parameters corresponding to the compiler interface of the AI learning library are configured according to the device information of the AI processor. Combined with the algorithm model obtained by the programming framework, the compiler interface of the AI learning library that has been configured is called to compile and obtain the binary instruction of the corresponding AI processor. The binary instruction is processed by the runtime library to generate the AI learning task, where the AI learning task is placed in a task queue, invoked by the driver, and executed by the cloud AI processor.

In practical applications, the AI learning library is configured to accelerate various AI learning algorithms on the AI processors, where the AI learning algorithms include, but are not limited to, a deep learning algorithm, a convolutional neural network algorithm, a recurrent neural network algorithm, and the like.

Specifically, the AI learning library generally has the following features:

1. Supporting Various Types of Basic Operators in Machine Learning Algorithms.

In one implementation, a variety of machine learning algorithms can be implemented through the combination of basic operators, thereby satisfying the requirements of versatility, flexibility, and scalability.

Figure 6:
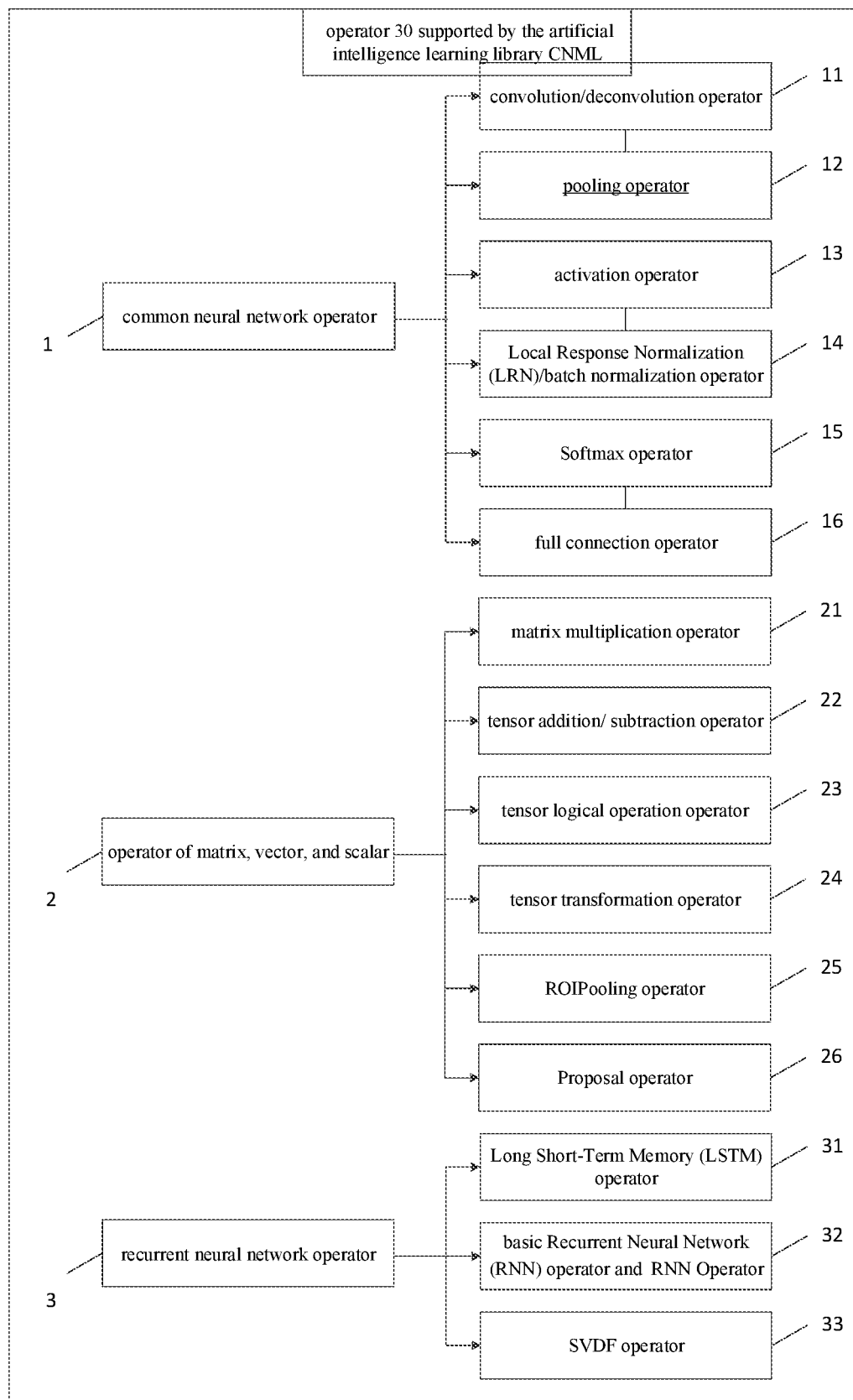
FIG. 6 is a diagram of various types of basic operators supported by an AI learning library.

For instance, the various types of basic operators involved herein may include: a common neural network operator, a matrix operator, a vector operator, a scalar operator, a recurrent neural network operator, etc. FIG. 6 is a diagram of various types of basic operators supported by an AI learning library. As shown in FIG. 6, the various types of basic operators supported by the AI learning library include the common neural network operator 1. The common neural network operator 1 often includes a convolution/deconvolution operator 11, a pooling operator 12, an activation operator 13, a Local Response Normalization (LRN)/batch normalization operator 14, a Softmax operator 15, and a full connection operator 16. In some embodiments, the activation operator 13 includes, but is not limited to, ReLU, Sigmoid, Tan h, and other operators that can be implemented by interpolation. The operator 2 of matrix, vector, and scalar may include a matrix multiplication operator 21, a tensor addition/subtraction operator 22, a tensor logical operation operator 23, a tensor transformation operator 24, a ROI-Pooling operator 25, and a Proposal operator 26. The tensor transformation operator 24 includes, but is not limited to, Crop, tensor Reshape, tensor Slice, tensor Concat, etc.; the recurrent neural network operator 3 includes a Long Short-Term Memory (LSTM) operator 31, a basic Recurrent Neural Network (RNN) operator, an RNN Operator 32, and an SVDF Operator 33. In practical applications, users can freely add new operators or change different versions of AI learning libraries according to their own needs, which is not detailed here. How to optimize the AI learning task on the software development platform based on the AI learning library will be described in detail when the process of debugging the AI learning task is described.

2. Supporting Fusion of Basic Operators.

In one implementation, when fused operators are being compiled, some compiler optimization methods such as memory multiplexing, memory access optimization, instruction pipeline, and data type optimization (for example, selecting different applicable data types) may be adopted, significantly improving the overall performance of the fused operators.

3. Supporting Generation of Offline Running File.

The offline running file generated after the running result is returned from the cloud AI computer system may include necessary network structure information such as a network weight of each computing node in the AI algorithm model and an instruction configured to indicate which computing function is realized by the computing node. Specifically, the instruction may include information such as computation properties of each computing node in the AI learning model and connection relationship between each computing node.

In one implementation, the offline running file can be separated from the AI learning library, and can be run independently based on the AI runtime library. In practical applications, since the offline running file is separated from the upper software stack, the execution of the offline running file has better performance and versatility.

The data processing method further includes:

step 502, transmitting, by the general-purpose processor, the AI learning task to the cloud AI processor, which selected from the device 101 according to the device information of the AI processor. The selected cloud AI processor can simulate the AI processor. In this way, the AI learning task generated on the software development platform 102 can be run on the cloud AI processor.

The data processing method further includes:

step 503, receiving, by the general-purpose processor, the running result corresponding to the AI learning task.

The cloud AI processor executes the AI learning task to generate a running result that is fed back to the software development platform 102 for display. The running result may include, but is not limited to, one or more pieces of information of whether running time of the AI learning task on the cloud AI processor satisfies a first expectation, whether the load information of the cloud AI processing system when the AI learning task is executed satisfies a second expectation, and whether the result of the AI learning task satisfies a third expectation. In some embodiments, the cloud AI processing system includes a general-purpose processor and a cloud AI processor. When the AI learning task is being executed, it may be necessary to know not only the load information of the cloud AI processor but also information of used memory and the occupancy rate of the general-purpose processor during execution. The reason why the load information is included in the running result is that if an AI learning task requires too much resources on the general-purpose processor, it is likely to work poorly or fail to run on the device 103.

The data processing method further includes:

step 504, determining, by the general-purpose processor, the offline running file according to the running result, where the offline running file is generated according to the device information of the AI processor and the binary instruction when the running result satisfies a preset requirement.

The offline running file may include one or more of the following: version information of the offline running file, version information of the AI processor, a binary instruction, a constant table, the size of input data/output data, data layout description information, and parameter information. Specifically, the version information of the offline running file represents different versions of the offline running file; and the version information of the AI processor refers to the hardware architecture information of the AI processor. For example, the hardware architecture information may be represented by a version number of the chip architecture, or may be represented by the functional description. The data layout description information refers to preprocessing of the layout and type of the input data/output data based on hardware characteristics. The constant table, the size of input data/output data, and the parameter information may be determined by the developed AI algorithm model. The parameter information may be weight data in an AI algorithm model. Data that is needed in the execution of the binary instruction may be stored in the constant table.

The device information of the AI processor includes the hardware architecture information and parameters of running environment of the AI processor. Herein the parameters of running environment include: the base clock speed of the AI processor, the access bandwidth of an off-chip memory and the AI processor, the size of an on-chip memory, the number of the cores of the AI processor, and/or the type of the operating unit or units of the AI processor.

If the running result satisfies the preset requirement, the corresponding offline running file is generated according to the binary instruction that satisfies the preset requirement. If the running result does not satisfy the preset requirement, at least one optimization in one of the below-listed optimization processes may be executed by the function debugging tool and/or the performance tuning tool until the running result satisfies the preset requirement. Afterwards, the corresponding offline running file is generated according to the binary instruction that satisfies the preset requirement. The optimization processes include: adjusting the hardware architecture information of the AI processor, adjusting the parameters of running environment of the AI processor, and optimizing the AI learning task.

When the running result fed back by the cloud AI processor satisfies the preset requirement, the binary instruction corresponding to the current AI learning task is written or "frozen" into an offline running file through an offline mode.

If the running result fed back by the cloud AI processor does not satisfy the preset requirement, the debugging process of the AI learning task falls into two scenarios. The first scenario is when the AI processor is in the chip design stage. The technical solutions disclosed herein are used to assess the chip design specifications based on the running result. In this case, the hardware architecture information and parameters of running environment of the chip can be changed. In such case, one or more of three optimizations: adjusting the hardware architecture information of the AI processor, adjusting the parameters of running environment of the AI processor, and optimizing the AI learning task, may be executed on the software development platform. All three optimization manners can adjust the binary instruction corresponding to the AI learning task accordingly. After each adjustment, the adjusted AI learning task in the task queue is called by the driver and is executed by the corresponding cloud AI processor to obtain a new running result. If the new running result is still not as expected, the users can repeat the above steps until the running result is satisfactory. The debugged binary instruction is written or "frozen" into an offline running file through an offline mode.

The second scenario is: regardless of whether the AI processor has taped out or not, the software design and development of the AI algorithm model for the AI processor may be enabled by using the software development platform to debug between the AI processor and the AI algorithm model. In this scenario, the hardware architecture information of the chip will not be modified freely unless, for example, the right to use the chip with other architecture versions has been purchased. Assuming that the hardware architecture information of the chip does not change, at least two optimization processes are available: adjusting the parameters of running environment within a range of parameters of the running environment supported by the current hardware architecture information, and optimizing the AI learning task that is executed on the software development platform. Both optimization operations can adjust the binary instruction corresponding to the AI learning task accordingly. After each adjustment, the AI learning task in the task queue is called by the driver and is executed by the corresponding cloud AI processor to obtain a new running result. If the new running result is still not as expected, the users can repeat the above steps until the running result is satisfactory. The debugged binary instruction is then written or "frozen" into an offline running file for future use in an offline mode.

The offline running file should generate consistent result whether it runs on the cloud AI processor or on the AI processor. The results should be the same or within a certain allowable error range. To achieve that, the cloud AI processor is selected from a plurality of AI processors in the cloud processor to simulate the corresponding AI processor according to the device information of the AI processor. The selection criteria include compatible hardware architecture and compatible instruction set between the cloud AI processor and the AI processor, in order to enable seamless migration of the offline running file from one processor to another.

In some embodiments, the device information of different types of AI processor may be pre-stored in the software development platform 102. According to actual needs, the target information is selected from the pre-stored device information, and the cloud AI processor to be used to simulate the AI processor is selected from the device 101 according to the target information.

In some embodiments, each time the device information is adjusted, the user sets different device information on the software development platform 102 according to the adjusted device information. The software development platform 102 receives the newly set device information of the AI processor, and selects the cloud AI processor from the device 101 to simulate the AI processor according to the newly received device information. It should be noted that the manners of obtaining the device information of the AI processor are only examples. Those skilled in the art may come up with other variations or modifications based on the embodiments disclosed herein when they understand the essence of the applied technical solutions. For example, the device 103 may transmit the request information to the software development platform 102, and the software development platform 102 may parse the request information to obtain the device information of the AI processor. As long as the functions realized and the technical effects achieved are similar to what is disclosed the present application, they shall fall within the scope of protection of the disclosure.

In practical applications, when selecting a cloud AI processor from the device 101 to simulate the AI processor in the device 103, the device information of the AI processor in the device 103 is written to the driver to enable the driver to select a suitable cloud AI processor from the device 101. The process of selecting a cloud AI processor includes:

selecting a well-matched cloud AI processor according to the hardware architecture information of the AI processor, where the hardware architecture of the selected cloud AI processor is compatible with hardware architecture of the corresponding AI processor, and the instruction set of the cloud AI processors is compatible with the instruction set of the corresponding AI processor; and adjusting the clock speed and the memory bandwidth of the cloud AI processor according to the parameters of the running environment of the AI processor.

In addition, there are four ways or approaches to optimize the AI learning task. First, users can compile a dynamic link library based on the programming language on the software development platform, and invoke the dynamic link library within the programming framework.

Second, users can develop new operators based on the programming language on the software development platform to create a new offline running file, in combination with the host AI learning library that is already available. Using a Proposal operator as an example, by replacing the Proposal operator in Faster-R-Cnn with a PluginOp operator and calling a proposal_kernel.mlu operator written in a special programming language, users can replace the Proposal operator in a Cambricon-Caffe framework with ProposalKernel written in a special programming language through PluginOp, which links the special programming language with the existing AI learning library, supports various features of the AI learning library and running modes such as online, offline, layer-by-layer, and fusion.

As indicated by the first and second approaches, a large number of layers and operators are already supported in the framework, and general models can be run on the server boards in a cloud processor. However, operators are updated frequently and they evolve quickly. Over time, individuals or organizations may have accumulated some custom operators and algorithms. In such case, because it is better not to expose the custom algorithms and because the underlying library cannot efficiently support the actual applications to meet the requirements, a dedicated programming language may be provided to help developers to develop algorithms independently, which will address the problem that previous development models are not sufficiently flexible.

Third, the users can select one of the versions of the current host AI learning library that is already available on the software development platform and match the corresponding AI runtime library. If the current host AI learning library that is already available cannot satisfy the requirements, requests can be sent through the software development platform to upgrade the version of the host AI learning library. Upon request, the operator can provide a new version of the AI learning library and the corresponding AI runtime library to the software development platform. In this way, the users can rely on the latest version of the AI learning library and the corresponding AI runtime library on the software development platform, and obtain the debugged binary instruction based on the latest version of the AI learning library.

Fourth, the users can adjust the AI algorithm model to achieve the goal of optimizing the AI learning task.

In practical applications, the purpose of optimizing the AI learning task may be achieved by at least one of the above four approaches. Regardless of whether the AI algorithm model is adjusted or not, the purpose of adjusting the AI learning task can be achieved by optimizing the AI learning library and/or adjusting the device information of the AI processor, and then the adaptation between the AI processor and the AI algorithm models can also be achieved.

The technical solutions as shown in FIG. 5 provide a software development platform, on which the users can conduct debugging of the function, performance and accuracy between the algorithm and the AI processor, and the offline running file generated after the debugging is completed can be deployed on multiple SoC chips of compatible architectures. In this way, the users can debug the function, performance and precision between the algorithm and the AI processor in advance without relying on the hardware, which greatly shortens the product development cycle. Moreover, there is no need to develop or select a matched development environment separately for each SoC chip.

Figure 7:
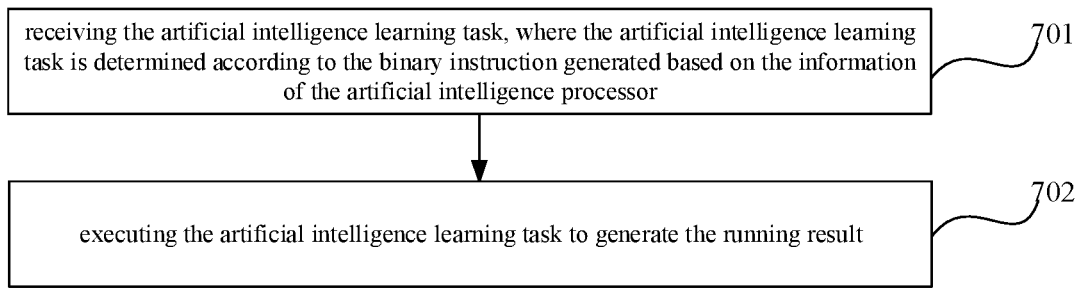
FIG. 7 is a second flow chart of a data processing method proposed by the present disclosure.

FIG. 7 is another flow chart of a data processing method proposed by the present disclosure. The data processing method is applied to the cloud AI processor. The data processing method includes:

step 701: receiving the AI learning task, where the AI learning task is determined according to the binary instruction generated based on the device information of the AI processor;

step 702: executing the AI learning task to generate the running result.

In this step, the running result includes, but is not limited to, at least one or more pieces of information of whether running time of the AI learning task on the cloud AI processor satisfies the first expectation, whether load information of the cloud AI processing system when the AI learning task is executed satisfies the second expectation, and whether the result of the AI learning task satisfies the third expectation.

It should be emphasized that all the related technical solutions shown in FIG. 5 are applicable to the technical solutions shown in FIG. 7, and details are not described herein again.

It should be clarified that, for the device 101, one application scenario is: in the set of the selected AI processors in the cloud processor, the hardware architecture information of all versions of the AI processor should be included as much as possible. For example, the models corresponding to the versions of the hardware architecture information and the models of the AI processor are A, B, and C, etc. The set of the cloud AI processors selected includes an AI processor of type A, an AI processor of type B, and an AI processor of type C. Another application scenario is that in the set of selected cloud AI processors, the hardware structure of the cloud AI processors can achieve high-configuration, mid-configuration, and low-configuration functions. For example, according to different application scenarios and actual needs, some functions of the selected cloud AI processor may be shielded, so that the AI processors with high-configuration functions could be converted to the AI processors with low-configuration functions or the AI processors with med-configuration functions, to meet the needs of different users. In this case, the software development platform 102 of the technical solution generates the binary instruction based on the device information of the AI processor, and the driver changes different parameters of running environment supported by the selected Cloud AI processor, so that some functions of the AI processor with high-configuration functions are shielded, and only the functions implemented are adapted to the functions of the corresponding AI processor. For instance, the value ranges of the parameters of running environment of the AI processor with high-configuration functions include all parameters of the running environment supported by the AI processor. For example, the size of the on-chip memory of the cloud AI processor is 100 M, and the size of the on-chip memory of the AI processor is less than 100 M.

Additionally, a time division multiplexing method combined with a virtual machine technology may be adopted to allocate the cloud AI processor of the device 101 efficiently, for example, based on the time period when the users use the resources of the device 101. In this way, the resources can be allocated to different AI learning tasks executed in different time periods, which could reduce the number of development environments in the cloud processor that are needed to be deployed.

Furthermore, in the set of the AI processors of the device 101, not all the AI processors must be hardware processors. They may also be FPGA or simulators. According to the mainstream of modern IC design verification technology, a circuit design completed in hardware description languages (Verilog or VHDL) can be quickly burned onto an FPGA through simple synthesis and layout. For the purposes of the present disclosure, if there is no well-matched hardware processor in the cloud AI processor, the FPGA can be used to provide simulation services for the users. According to the device information of the AI processor, an FPGA that meets the requirements is selected. The selected FPGA has a mirroring file corresponding to the hardware architecture information of the AI processor. If there is no FPGA that meets the requirements, the software development platform 102 can burn the mirroring file corresponding to the hardware architecture information of the AI processor onto an idle FPGA. The newly formed FPGA can then execute the AI learning task transmitted by the software development platform.

For the cloud AI processor, a more fine-tuned resource allocation can be provided. For example, the user A generates an AI learning task on the software development platform 102 based on the AI processor. This task requires or is composed of M cores, and the well-matched cloud AI processor selected at the device 101 has N cores. In the selected cloud AI processor, P cores out of the N cores have been used by the AI learning task initiated by the user B. If M+P<=N and the device information of A's AI processor and the device information of B's AI processor are the same, then the AI runtime library in the software development platform 102 can allocate the AI learning tasks initiated by different users to different cores of the same cloud AI processor. Different AI learning task can be executed on different cores to achieve finer allocation of resources of the cloud AI processor.

In addition, the cloud AI processor may be a common AI processor with a non-reconfigurable architecture or an AI processor with a reconfigurable architecture. The AI processor with a reconfigurable architecture uses the device information in the driver to adjust the parameters of running environment inside a reconfigurable chip, and calls functional modules inside the reconfigurable chip according to the AI learning task transmitted by the software development platform 102. That is, according to an actual application, the functional modules inside the reconfigurable chip may be adjusted so that the adjusted chip can simulate the AI processor.

Based on the above description of the cloud AI processor, in this disclosure, the software development platform 102 counts the number of users of the cloud AI processors with different hardware architecture information in each time period over a period of time, and estimates a minimum value V that can meet the users' needs, where the minimum value V is the minimum number of deployed cloud AI processors. On this basis, a small number of W redundant AI processors are added for fault tolerance or to prevent the sudden increase in the number of users. Then (V+W) is the number of AI processors that need to be deployed for the device 101. At the same time, the software development platform 102 periodically tracks the change in the number of users, and may request a change of the number of AI processors deployed in the device 101, to better meet customer needs and reduce overhead in the device 101.

It can be seen from the above description that the AI processors deployed in the device 101 could be dynamically adjusted according to the AI learning task transmitted by the software development platform in a real-time deployment manner. In this way, by configuring different development environments, the time division multiplexing method adapts to allocate the cloud AI processor resource as required by the AI learning tasks executed at each time period, which can reduce the number of development environments of the cloud AI processors that need to be deployed. The above cloud AI resource allocation process may be transparent to the users.

Figure 8:
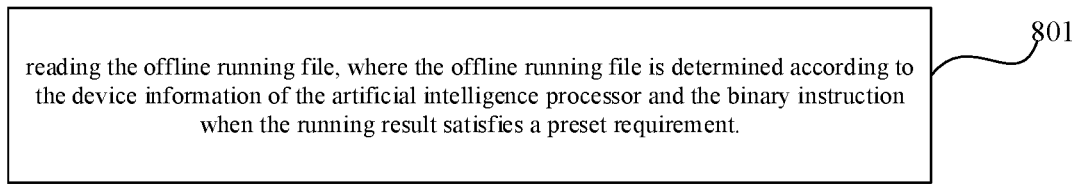
FIG. 8 is a third flow chart of a data processing method proposed by the present disclosure.

FIG. 8 is another flow chart of a data processing method proposed by the present disclosure. The data processing method is applicable to the AI processor, which includes:

step 801, reading the offline running file, where the offline running file is determined according to the device information of the AI processor and the binary instruction when the running result satisfies a preset requirement.

It should be emphasized that all the related technical solutions shown in FIG. 5 and FIG. 7 are applicable to the technical solutions shown in FIG. 8, and the details are not described herein again.

On the software development platform 102, according to the running result fed back from the cloud AI processor, the AI learning task generated for the AI processor is optimized and debugged. After the running result meets the expected requirement, the binary instruction of the debugged AI learning task is converted into an offline running file, which may incorporate previous debugging and performance information. In future practical applications, the offline running file can be compiled directly, independent from the programming framework. In this way, the offline running file can be crossly compiled on the device 103 for field deployment and still maintain adequate accuracy.

Figure 9:
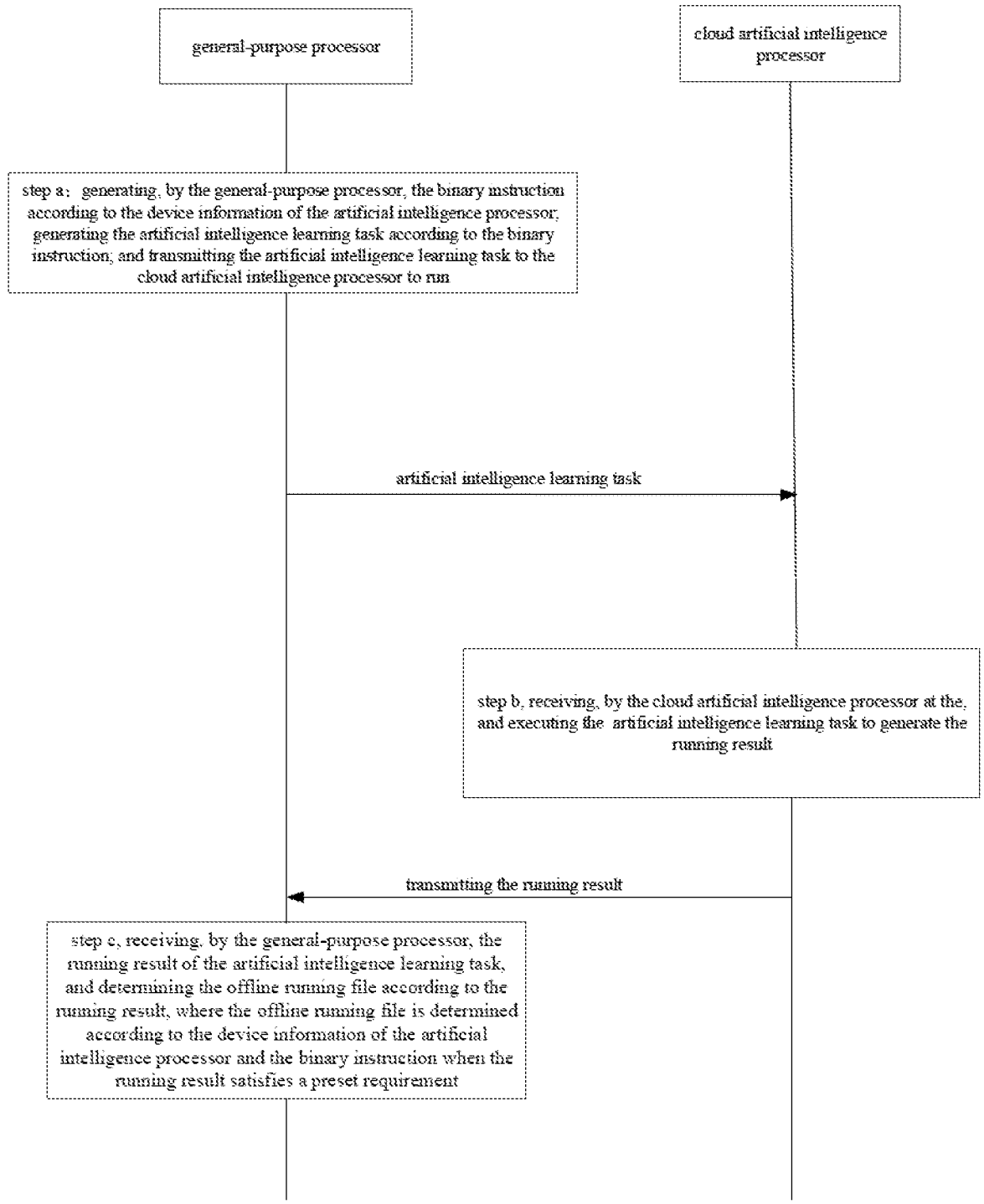
FIG. 9 is a fourth flow chart of a data processing method proposed by the present disclosure.

FIG. 9 is another flow chart of a data processing method proposed by the present disclosure. The system includes a general-purpose processor and a cloud AI processor. The data processing method includes:

step a, generating, by the general-purpose processor, the binary instruction according to the device information of the AI processor; generating the AI learning task according to the binary instruction; and transmitting the AI learning task to the cloud AI processor to run;

step b, receiving, by the cloud AI processor, and executing the AI learning task to generate the running result;

step c, receiving, by the general-purpose processor, the running result of the AI learning task, and determining the offline running file according to the running result, where the offline running file is determined according to the device information of the AI processor and the binary instruction when the running result satisfies a preset requirement.

It should be emphasized that all the related technical solutions shown in FIG. 5 and FIG. 7 are applicable to the technical solutions shown in FIG. 9, and the details are not described herein again.

Figure 10:
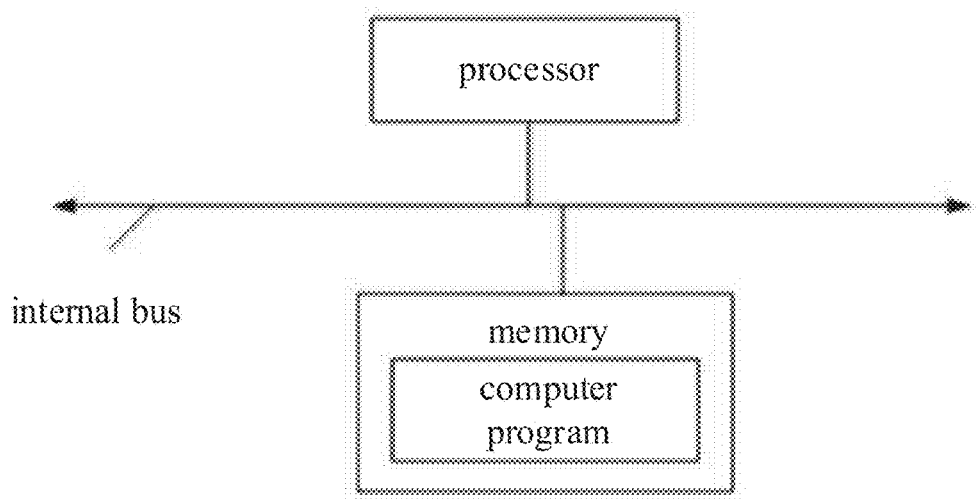
FIG. 10 is a functional block diagram of a data processing device proposed by the present disclosure.

FIG. 10 is a functional block diagram of a data processing device proposed by the present disclosure. The data processing device includes a memory and a general-purpose processor, where a computer program that can be run on the general-purpose processor is stored in the memory. The data processing flow that is being implemented when the general-purpose processor executes the computer program includes:

generating the binary instruction according to the device information of the AI processor, and generating the AI learning task according to the binary instruction;

transmitting the AI learning task to the cloud AI processor to run;

receiving the running result of the AI learning task; and determining the offline running file according to the running result, where the offline running file is generated according to the device information of the AI processor and the binary instruction when the running result satisfies a preset requirement.

Optionally, the device information includes the hardware architecture information and the parameters of running environment of the AI processor.

Optionally, the parameters of running environment include at least one of the base clock speed of the AI processor, an access bandwidth of an off-chip memory and the AI processor, the size of an on-chip memory, the number of cores in the AI processor, and the type of an operating unit or units of the AI processor.

Optionally, the data processing flow further includes:

receiving the device information of the AI processor.

Optionally, the data processing flow further includes:

writing the device information into the driver to select a well-matched cloud AI processor according to the device information in the driver.

Optionally, the data processing flow when the general-purpose processor executes the computer program to determine the offline running file according to the running result includes:

if the running result satisfies the preset requirement, generating the corresponding offline running file according to the binary instruction that satisfies the preset requirement.

Optionally, the data processing flow when the general-purpose processor executes the computer program to determine the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, and optimizing the AI learning task.

Optionally, the data processing flow when the general-purpose processor optimizes the AI learning task includes:

optimizing the AI learning task by a special programming language.

Optionally, the data processing flow when the general-purpose processor optimizes the AI learning task further includes:

optimizing the AI learning task by updating the version of the AI learning task.

Optionally, the data processing flow when the general-purpose processor optimizes the AI learning task further includes:

adjusting the AI algorithm model.

Optionally, the running result may include one or more pieces of information such as whether the processing time of the AI learning task on the cloud AI processor satisfies the first expectation, whether the load information of the cloud AI processing system when the AI learning task is executed satisfies the second expectation, and whether the result of the AI learning task satisfies the third expectation.

The functions implemented by the general-purpose processor can be explained in comparison with the foregoing embodiments and the same technical effects of those embodiments can be achieved as well. The details are not described herein again.

In the embodiments of the present disclosure, the memory may include physical devices for storing information, where the information is typically digitalized and then stored in a device that may be electric, magnetic or optical. The memory in the embodiments may further include: a device for storing information in an electric device such as a RAM, a ROM, etc.; in a magnetic device, such as a hard disk, a floppy disk, a magnetic tape, a magnetic core memory, a magnetic bubble memory, and a USB flash drive; or in an optical device, such as a CD or a DVD. Of course, there are other types of memory devices, such as quantum memory device, graphene memory device, and the like.

Figure 11:
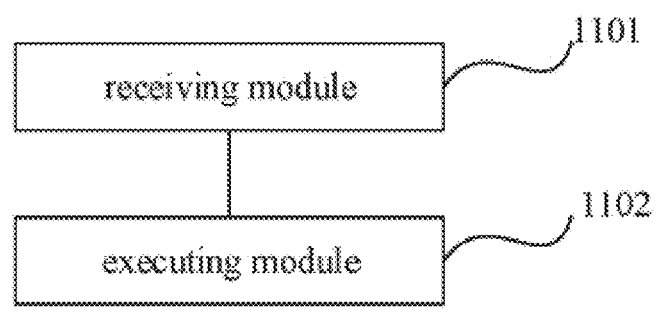
FIG. 11 is a functional block diagram of an AI processor proposed by the present disclosure.

FIG. 11 is a functional block diagram of an AI processor proposed by the present disclosure. The AI processor includes:

a receiving module 1101 configured to receive the AI learning task, where the AI learning task is determined according to the binary instruction generated based on the device information of the AI processor; and an executing module 1102 configured to execute the AI learning task to generate the running result.

Optionally, the running result generated by the executing module may include one or more pieces of information such as whether the running time of the AI learning task on the cloud AI processor satisfies the first expectation, whether the load information of a cloud AI processing system when the AI learning task is executed satisfies the second expectation, and whether the result of the AI learning task satisfies the third expectation.

Optionally, the cloud AI processor includes at least one of a hardware piece of the AI processor, a field programmable gate array, and a simulator.

Optionally, the AI processor is an AI processor with a reconfigurable architecture.

Figure 12:
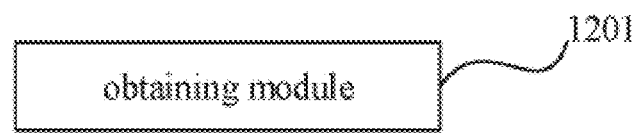
FIG. 12 is a second functional block diagram of an AI processor proposed by the present disclosure.

FIG. 12 is another functional block diagram of an AI processor proposed by the present disclosure. The AI processor includes:

an obtaining module 1201 configured to obtain the offline running file, where the offline running file is generated according to the device information of the AI processor and the binary instruction when the running result satisfies the preset requirement.

The AI processor further includes:

a transmitting module configured to transmit request information, where the request information includes the device information of the AI processor.

Optionally, the device information includes the hardware architecture information and the parameters of running environment of the AI processor.

Optionally, the parameters of running environment include at least one of the base clock speed of the AI processor, the access bandwidth of an off-chip memory and the AI processor, the size of an on-chip memory, the number of the cores of the AI processor, and the type of an operating unit or units of the AI processor.

Figure 13:
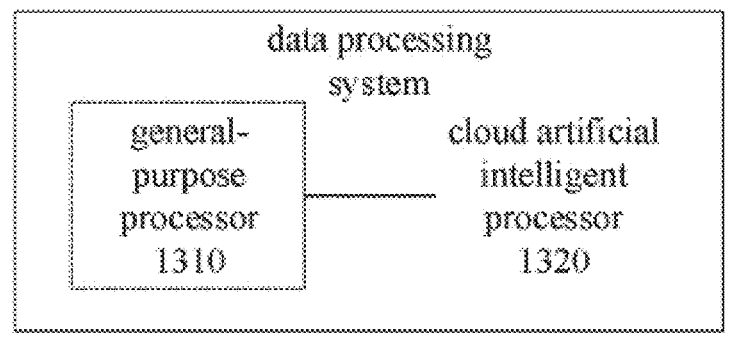
FIG. 13 is a structural diagram of a data processing system proposed by the present disclosure.

FIG. 13 is a structural diagram of a data processing system proposed by the present disclosure. The data processing system includes a general-purpose processor 1310 and a cloud AI processor 1320. It should be understood that, in this embodiment, for the specific implementation of the general-purpose processor 1310 and the cloud AI processor 1320, please refer to the foregoing description, which will not be repeated herein.

The embodiment of the present disclosure further provides a readable storage medium, in which the computer program is stored. The process of executing the computer program embodies the data processing method shown in FIG. 5, FIG. 7, FIG. 8, and FIG. 9.

It can be seen from the above descriptions that the embodiments of the present disclosure provide a data processing method and related products. Regardless of whether the AI processor is tape out or not, this technical solution can realize debugging between the AI algorithm model and the AI processor in advance.

Those skilled in the art also know that in addition to implementing the technical solution on the client and the server in the form of computer readable program code, the technical solution can also be implemented on the client and the server in the form of logic gate, switch, ASIC, programmable logic controller and embedded microcontroller. Therefore, the client and server may be considered as a hardware component, and the devices for implementing various functions included within the hardware component can also be considered as structures inside the hardware component. Or even the devices for implementing various functions can be considered as software modules which can implement methods or structures within the hardware component.

From the above descriptions of the embodiments of the present disclosure, those skilled in the art may clearly know that this application can be achieved by means of software together with a necessary general-purpose hardware platform. Based on such understanding, the technical solutions of the present disclosure essentially, or the part of the technical solutions that contributes to the related art may be embodied in the form of a software product which is stored in a storage medium (such as ROM/RAM, Disk, and Compact Disc (CD)), where the storage medium includes instructions for causing a computer device (which may be a personal computer, a server, or a network device and so on) to perform the methods described in each embodiment of the present disclosure or in certain parts of the embodiments.

Each embodiment in the present disclosure is described step by step, and the same and similar parts between all the embodiments may be referred to each other, and each embodiment focuses on differences from other embodiments. In particular, for the implementation of the client and server, reference can be made to the embodiment of the aforementioned method.

The application can be embodied in the context of instructions executed by the computer, such as a program module. In general, the program module includes routines, programs, objects, components, data structures, and the like that perform particular tasks or implement particular abstract data types. The present application can also be implemented in a distributed computing environment where tasks are performed by remote processing devices that are connected through a communication network. In the distributed computing environment, the program module can be located in both host and remote computer storage medium including storage devices.

Although this application is described by means of embodiments, those skilled in the art should know that this application has many variations and changes that do not depart from the spirit of this application, and the attached claims should include these variations and changes that do not depart from the spirit of this application.

Furthermore, the above descriptions can be better understood in accordance with the following terms:

A1. A data processing method applied to a data processing system, which includes a general-purpose processor and a cloud AI processor, wherein the data processing method includes:

generating, by the general-purpose processor, a binary instruction according to device information of the AI processor at an end; generating, by the general-purpose processor, an AI learning task according to the binary instruction; and transmitting, by the general-purpose processor, the AI learning task to the cloud AI processor for running;

receiving, by the cloud AI processor, the AI learning task; and executing, by the cloud AI processor, the AI learning task to generate a running result; and receiving, by the general-purpose processor, the running result corresponding to the AI learning task; determining, by the general-purpose processor, an offline running file according to the running result, wherein the offline running file is generated according to the device information of the AI processor and the binary instruction when the running result satisfies a preset requirement.

A2. The data processing method of A1, wherein the device information includes hardware architecture information and parameters of running environment of the AI processor.

A3. The data processing method of A2, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

A4. The data processing method of A1 further includes:

receiving, by the general-purpose processor, the device information of the AI processor.

A5. The data processing method of A4 further includes:

writing, by the general-purpose processor, the device information into a driver to select a well-matched cloud AI processor based on the device information in the driver.

A6. The data processing method of A1, wherein the determining the offline running file according to the running result includes:

if the running result satisfies a preset requirement, generating the corresponding offline running file according to the binary instruction that satisfies the preset requirement.

A7. The data processing method of A1, wherein the determining the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

A8. The data processing method of A7, wherein steps of optimizing the AI learning task include:

optimizing the AI learning task by a special programming language.

A9. The data processing method of A7 or A8, wherein the steps of optimizing the AI learning task further include:

optimizing the AI learning task by updating the version of the AI learning task.

A10. The data processing method of any of A7-A9, wherein the steps of optimizing the AI learning task further include:

adjusting the AI algorithm model.

A11. The data processing method of any of A1-A10, wherein the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

A12. The data processing method of A1, wherein the cloud AI processor includes at least one of a hardware entity of the AI processor, a field programmable gate array, and a simulator.

A13. The data processing method of A2, wherein the hardware entity of the AI processor is an AI processor with a reconfigurable architecture.

B14. A data processing device including a memory, a general-purpose processor, and a cloud AI processor, where a computer program running on the general-purpose processor and/or the cloud AI processor is stored in the memory.

The general-purpose processor is configured to generate a binary instruction according to device information of the AI processor, and then generate an AI learning task according to the binary instruction, and transmit the AI learning task to the cloud AI processor for running;

the cloud AI processor is configured to receive and execute the AI learning task, and then generate a running result; and the general-purpose processor is configured to receive the running result corresponding to the AI learning task, and determine an offline running file according to the running result; where the offline running file is generated according to the device information of the AI processor and the binary instruction when the running result satisfies a preset requirement.

B15. The data processing device of B14, wherein the device information includes hardware architecture information and parameters of running environment of the AI processor.

B16. The data processing device of B15, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

B17. The data processing device of B14, wherein the general-purpose processor is further configured to:
receive the device information of the AI processor.

B18. The data processing device of B17, wherein the general-purpose processor is further configured to:
write the device information into a driver to select a well-matched cloud AI processor based on the device information in the driver.

B19. The data processing device of B14, wherein the general-purpose processor is configured to determine the offline running file according to the running result, which includes:
if the running result satisfies a preset requirement, the general-purpose processor is configured to generate the corresponding offline running file according to the binary instruction that satisfies the preset requirement.

B20. The data processing device of B14, wherein the general-purpose processor is further configured to determine the offline running file according to the running result, which includes:
if the running result does not satisfy the preset requirement, the general-purpose processor is configured to execute at least one of the optimization manners in the following process until the running result satisfies the preset requirement, and generate the corresponding offline running file according to the binary instruction that satisfies the preset requirement, where the optimization manners include: adjusting the hardware architecture information of the AI processor, adjusting the parameters of running environment of the AI processor, or optimizing the AI learning task.

B21. The data processing device of B20, wherein steps of optimizing the AI learning task include:
optimizing the AI learning task by a special programming language.

B22. The data processing device of B20 or B21, wherein the steps of optimizing the AI learning task further include:
optimizing the AI learning task by updating the version of the AI learning task.

B23. The data processing device of any of B20-B22, wherein the steps of optimizing the AI learning task further include:
adjusting the AI algorithm model.

B24. The data processing device of any of B14-B23, wherein the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

B25. The data processing device of B14, wherein the cloud AI processor includes at least one of a hardware entity of the AI processor, a field programmable gate array, and a simulator.

B26. The data processing device of B25, wherein the hardware entity of the AI processor is an AI processor with a reconfigurable architecture.

C1. A data processing method applied to a general-purpose processor, including:
generating, by the general-purpose processor, a binary instruction according to device information of the AI processor, and generating an AI learning task according to the binary instruction;
transmitting, by the general-purpose processor, the AI learning task to the cloud AI processor for running;
receiving, by the general-purpose processor, a running result corresponding to the AI learning task; and
determining, by the general-purpose processor, an offline running file according to the running result; wherein the offline running file is generated according to the device information of the AI processor and the binary instruction when the running result satisfies a preset requirement.

C2. The data processing method of C1, wherein the device information includes hardware architecture information and parameters of running environment of the AI processor.

C3. The data processing method of C2, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

C4. The data processing method of C1 further includes:
receiving, by the general-purpose processor, the device information of the AI processor.

C5. The data processing method of C1 further includes:
writing, by the general-purpose processor, the device information into a driver to select a well-matched cloud AI processor based on the device information in the driver.

C6. The data processing method of C1, wherein the determining the offline running file according to the running result includes:

if the running result satisfies a preset requirement, generating the corresponding offline running file according to the binary instruction that satisfies the preset requirement.

C7. The data processing method of C1, wherein the determining the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

C8. The data processing method of C7, wherein steps of optimizing the AI learning task include:

optimizing the AI learning task by a special programming language.

C9. The data processing method of C7 or C8, wherein the steps of optimizing the AI learning task further include:

optimizing the AI learning task by updating the version of the AI learning task.

C10. The data processing method of any of C7-C9, wherein the steps of optimizing the AI learning task further include:

adjusting the AI algorithm model.

C11. The data processing method of any of C1-C10, wherein the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

D12. A data processing device including a memory and a general-purpose processor, wherein a computer program that can be run on the general-purpose processor is stored in the memory. The data processing flow implemented when the general-purpose processor executes the computer program includes:

generating the binary instruction according to the device information of the AI processor, and generating the AI learning task according to the binary instruction;

transmitting the AI learning task to the cloud AI processor to run;

receiving the running result of the AI learning task; and determining the offline running file according to the running result, where the offline running file is generated according to the device information of the AI processor and the binary instruction when the running result satisfies a preset requirement.

D13. The data processing device of D12, wherein the device information includes the hardware architecture information and the parameters of running environment of the AI processor.

D14. The data processing device of D13, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

D15. The data processing device of D12, wherein the data processing flow implemented when the general-purpose processor executes the computer program further includes:

receiving the device information of the AI processor.

D16. The data processing device of D12 or D15, wherein the data processing flow implemented when the general-purpose processor executes the computer program further includes:

writing the device information into the driver to select the well-matched Cloud AI processor according to the device information in the driver.

D17. The data processing device of D12, the data processing flow implemented when the general-purpose processor executes the computer program to determine the offline running file according to the running result includes:

if the running result satisfies the preset requirement, generating the corresponding offline running file according to the binary instruction that satisfies the preset requirement.

D18. The data processing device of D12, the data processing flow implemented when the general-purpose processor executes the computer program to determine the offline running file according to the running result further includes:

if the running result does not satisfy the preset requirement, executing at least one of the optimization manners in the following process until the running result satisfies the preset requirement, and generating the corresponding offline running file according to the binary instruction that satisfies the preset requirement, where the optimization manners include: adjusting the hardware architecture information of the AI processor, adjusting the parameters of running environment of the AI processor, or optimizing the AI learning task.

D19. The data processing device of D18, the data processing flow implemented when the general-purpose processor optimizes the AI learning task includes:

optimizing the AI learning task by a special programming language.

D20. The data processing device of D18 or D19, the data processing flow implemented when the general-purpose processor optimizes the AI learning task further includes:

optimizing the AI learning task by updating the version of the AI learning task.

D21. The data processing device of any of D18-D20, the data processing flow implemented when the general-purpose processor optimizes the AI learning task further includes:

adjusting the AI algorithm model.

D22. The data processing device of any of D12-D21, the running result includes one or more pieces of information of whether the running time of the AI learning task on the cloud AI processor satisfies the first expectation, whether load information of a cloud AI processing system when the AI learning task is executed satisfies the second expectation, and whether the result of the AI learning task satisfies the third expectation.

E23. A data processing method applied to a cloud AI processor, including:

receiving the AI learning task, where the AI learning task is determined according to the binary instruction generated based on the device information of the AI processor; and executing the AI learning task to generate the running result.

E24. The data processing method of E23, wherein the running result includes one or more pieces of information of whether running time of the AI learning task on the cloud AI processor satisfies the first expectation, whether load information of a cloud AI processing system when the AI learning task is executed satisfies the second expectation, and whether the result of the AI learning task satisfies the third expectation.

E25. The data processing method of E23, wherein the cloud AI processor includes at least one of a hardware entity of the AI processor, a field programmable gate array, and a simulator.

E26. The data processing method of E25, wherein the cloud AI processor is an AI processor with a reconfigurable architecture.

F27. An AI processor, including:
a receiving module configured to receive the AI learning task, where the AI learning task is determined according to the binary instruction generated based on the device information of the AI processor; and
an executing module configured to execute the AI learning task to generate the running result.

F28. The AI processor of F27, wherein the running result generated by the executing module includes at least one of pieces of information of whether the running time of the AI learning task on the cloud AI processor satisfies the first expectation, whether load information of a cloud AI processing system when the AI learning task is executed satisfies the second expectation, and whether the result of the AI learning task satisfies the third expectation.

F29. The AI processor of F27, wherein the cloud AI processor includes at least one of a hardware entity of the AI processor, a field programmable gate array, and a simulator.

F30. The AI processor of F29, wherein the cloud A1 processor is an AI processor with a reconfigurable architecture.

G31. A data processing method applied to an AI processor, including:
obtaining an offline running file, where the offline running file is generated according to the device information of the AI processor and the binary instruction when the running result satisfies a preset requirement.

G32. The data processing method of G31 further includes:
transmitting request information, where the request information includes the device information of the AI processor.

G33. The data processing method of G31, wherein the device information includes the hardware architecture information and the parameters of running environment of the AI processor.

G34. The data processing method of G33, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

H35. An AI processor, including:
an obtaining module configured to obtain the offline running file, where the offline running file is generated according to the device information of the AI processor and the binary instruction when the running result satisfies the preset requirement.

H36. The AI processor of H35, further including:
a transmitting module configured to transmit request information, where the request information includes the device information of the AI processor.

H37. The AI processor of H36, wherein the device information includes the hardware architecture information and the parameters of running environment of the AI processor.

H38. The AI processor of H37, wherein the parameters of running environment include at least one of a base clock speed of the AI processor, an access bandwidth of an off-chip memory and the AI processor, a size of an on-chip memory, the number of the cores of the AI processor, and a type of an operating unit of the AI processor.

What is claimed is:

1. A data processing method implemented in a data processing system comprising a general-purpose processor and a plurality of cloud artificial intelligence (AI) processors, wherein the data processing method comprises:
generating, by the general-purpose processor, a binary instruction according to device information of a first AI processor, wherein the device information comprises a hardware architecture of the first AI processor, an instruction set associated with the first AI processor, and parameters of the running environment associated with the first AI processor;
generating, by the general-purpose processor, an AI learning task according to the binary instruction;
writing, by the general-purpose processor, the device information into a driver executing on the general-purpose processor;
selecting, by the driver, a cloud AI processor of the plurality of cloud AI processors based on the device information written into the driver, wherein the cloud AI processor is selected based on a compatibility between both a hardware architecture and an instruction set of the cloud AI processor and the hardware architecture and the instruction set associated with the first AI processor;
in response to selecting the cloud AI processor, transmitting, by the general-purpose processor, the AI learning task to the cloud AI processor for running;
receiving, by the cloud AI processor, the AI learning task;
executing, by the cloud AI processor, the AI learning task to generate a running result;
receiving, by the general-purpose processor, the running result; and
determining, by the general-purpose processor, whether the running result satisfies a preset requirement, wherein
if the running result does not satisfy the preset requirement, performing the steps of:
a. updating, by the general-purpose processor, the device information by adjusting the parameters of the running environment;
b. generating, by the general-purpose processor, an updated binary instruction according to the adjusted parameters;
c. generating, by the general-purpose processor, an updated AI learning task according to the binary instruction;
d. writing, by the general-purpose processor, the updated device information into the driver executing on the general-purpose processor;
e. executing, by the AI cloud processor, the updated AI learning task, and
f. repeating steps a through d until the running result satisfies the preset requirement; and
if the running result satisfies the preset requirement,
determining an offline running file according to the running result wherein the offline running file is generated based on the device information of the first AI processor and the binary instruction when the running result satisfies a preset requirement, wherein the parameters of the running environment include at least one of:
a base clock speed of the first AI processor;
an access bandwidth of an off-chip memory and the first AI processor;
a size of an on-chip memory; and
a number of cores in the first AI processor.

2. The data processing method of claim 1, wherein determining the offline running file according to the running result includes:
if the running result satisfies the preset requirement, generating a corresponding offline running file according to the binary instruction.

3. The data processing method of claim 1, wherein determining the offline running file according to the running result further includes:
if the running result does not satisfy the preset requirement,
executing at least one optimization operations until the running result satisfies the preset requirement; and
generating the corresponding offline running file according to the binary instruction that satisfies the preset requirement, where the optimization operations include one or more of the following:
adjusting hardware architecture information of the first AI processor;
adjusting parameters of running environment of the first AI processor; and
optimizing the AI learning task.

4. The data processing method of claim 3, wherein the steps of optimizing the AI learning task include one or more of the following:
optimizing the AI learning task by a special programming language;
optimizing the AI learning task by updating a version of the AI learning task; and
adjusting an AI algorithm model.

5. The data processing method of claim 1, wherein the running result includes one or more pieces of information including:
whether a running time of the AI learning task on the first AI processor satisfies a first expectation;
whether load information of a cloud AI processing system when the AI learning task is executed satisfies a second expectation; and
whether a result of the AI learning task satisfies a third expectation.

6. The data processing method of claim 1, wherein the first AI processor includes at least one of:
a field programmable gate array; and
a simulator.

7. A data processing device, comprising:
a memory;
a general-purpose processor;
a plurality of cloud AI processors in a cloud processing system, wherein a computer program running on the general-purpose processor and/or the first AI processor is stored in the memory;
the general-purpose processor is configured to:
generate a binary instruction according to device information of the first AI processor, wherein the device information comprises a hardware architecture of the first AI processor, an instruction set associated with the first AI processor, and parameters of the running environment associated with the first AI processor,
generate an AI learning task according to the binary instruction;
write, by the general-purpose processor, the device information into a driver executing on the general-purpose processor;
select, by the driver, a cloud AI processor of the plurality of cloud AI processors based on the device information written into the driver, wherein the cloud AI processor is selected based on a compatibility between both a hardware architecture and an instruction set of the cloud AI processor and the hardware architecture and the instruction set associated with the first AI processor; and
in response to selecting the cloud AI processor, transmit the AI learning task to the cloud AI processor for running;
the cloud AI processor is configured to receive and execute the AI learning task to generate a running result; and
the general-purpose processor is configured to:
receive the running result corresponding to the AI learning task; and
determine, by the general purpose processor, whether the running result satisfies a preset requirement, wherein
if the running result does not satisfy the preset requirement, performing the steps of:
a. updating, by the general-purpose processor, the device information by adjusting the parameters of the running environment;
b. generating, by the general-purpose processor, an updated binary instruction according to the adjusted parameters;
c. generating, by the general-purpose processor, an updated AI learning task according to the binary instruction;
d. writing, by the general-purpose processor, the updated device information into the driver executing on the general-purpose processor;
e. executing, by the AI cloud processor, the updated AI learning task, and
f. repeating steps a through d until the running result satisfies the preset requirement; and
if the running result satisfies the preset requirement, determine an offline running file according to the running result;
wherein the offline running file is generated according to the device information of the first AI processor and the binary instruction, when the running result satisfies the preset requirement, wherein the parameters of the running environment include at least one of:
a base clock speed of the first AI processor;
an access bandwidth of an off-chip memory and the first AI processor;
a size of an on-chip memory; and
a number of cores in the first AI processor.

8. The data processing device of claim 7, wherein the general-purpose processor is further configured to determine the offline running file according to the running result, and wherein
if the running result satisfies the preset requirement, the general-purpose processor is configured to generate the corresponding offline running file according to the binary instruction.

9. The data processing device of claim 7, wherein the general-purpose processor is further configured to determine the offline running file according to the running result, and wherein:
if the running result does not satisfy the preset requirement, the general-purpose processor is configured to:
execute at least one optimization operation until the running result satisfies the preset requirement; and generate a corresponding offline running file according to the binary instruction that satisfies the preset requirement, where the optimization operation includes one or more of the following:
adjusting the hardware architecture information of the first AI processor;
adjusting the parameters of running environment of the first AI processor; and
optimizing the AI learning task.

10. The data processing device of claim 9, wherein steps of optimizing the AI learning task include one or more of the following:
optimizing the AI learning task by a special programming language;
optimizing the AI learning task by updating a version of the AI learning task; and
adjusting an AI algorithm model.

11. The data processing device of claim 7, wherein the running result includes one or more pieces of information including:
whether a running time of the AI learning task on the cloud AI processor satisfies a first expectation;
whether load information of a cloud AI processing system when the AI learning task is executed satisfies a second expectation; and
whether a result of the Al learning task satisfies a third expectation.

12. The data processing device of claim 7, wherein the first Al processor includes at least one of:
a field programmable gate array; and
a simulator.

13. A method of testing a performance of an AI computation model running on a first an AI processor through simulation, comprising:
generating, by a general-purpose processor, a set of binary instructions for the AI computation model based on device information of the first AI processor and the AI computation model, wherein the device information comprises a hardware architecture of the first AI processor, an instruction set associated with the first AI processor, and parameters of the running environment associated with the first AI processor;
generating an AI learning task based on the set of binary instructions;
writing, by the general-purpose processor, the device information into a driver executing on the general-purpose processor;
selecting, by the driver, a cloud AI processor of a plurality of cloud AI processors based on the device information written into the driver, wherein the cloud AI processor is selected based on a compatibility between both a hardware architecture and an instruction set of the cloud AI processor and the hardware architecture and the instruction set associated with the first AI processor;
in response to selecting the cloud AI processor, transmitting the AI learning task to the cloud AI processor in a cloud processing system for execution;
receiving a running result from the cloud processing system;
determining, by the general-purpose processor, whether the running result satisfies a preset requirement, wherein
if the running result does not satisfy the preset requirement, performing the steps of:
a. updating, by the general-purpose processor, the device information by adjusting the parameters of the running environment;
b. generating, by the general-purpose processor, an updated binary instruction according to the adjusted parameters;
c. generating, by the general-purpose processor, an updated AI learning task according to the binary instruction;
d. writing, by the general-purpose processor, the updated device information into the driver executing on the general-purpose processor;
e. executing, by the AI cloud processor, the updated AI learning task, and
f. repeating steps a through d until the running result satisfies the preset requirement; and
responsive to determining that the running result meets the requirement, generating an offline running file based on the device information and the set of binary instructions, wherein the parameters of the running environment include at least one of:
a base clock speed of the first AI processor;
an access bandwidth of an off-chip memory and the first AI processor;
a size of an on-chip memory; and
a number of cores in the first AI processor.

* * * * *